(12) United States Patent
Sinclair et al.

(10) Patent No.: US 7,558,905 B2
(45) Date of Patent: Jul. 7, 2009

(54) RECLAIMING DATA STORAGE CAPACITY IN FLASH MEMORY SYSTEMS

(75) Inventors: Alan W. Sinclair, Falkirk (GB); Barry Wright, Edinburgh (GB)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/382,235

(22) Filed: May 8, 2006

(65) Prior Publication Data

US 2007/0033330 A1 Feb. 8, 2007

Related U.S. Application Data

(60) Provisional application No. 60/705,388, filed on Aug. 3, 2005.

(51) Int. Cl.
*G06F 12/00* (2006.01)
(52) U.S. Cl. .............................. 711/103; 711/154
(58) Field of Classification Search .............. 711/103, 711/154; 707/206; 365/185.33
See application file for complete search history.

(56) References Cited

U.S. PATENT DOCUMENTS

| | | | |
|---|---|---|---|
| 4,800,520 A | 1/1989 | Iijima | |
| 4,802,117 A | 1/1989 | Chrosny et al. | |
| 5,226,155 A | 7/1993 | Iijima | |
| 5,341,339 A * | 8/1994 | Wells | 365/185.11 |
| 5,369,754 A | 11/1994 | Fandrich et al. | |
| 5,388,083 A | 2/1995 | Assar et al. | |
| 5,404,485 A | 4/1995 | Ban | |
| 5,568,423 A | 10/1996 | Jou et al. | |
| 5,570,315 A | 10/1996 | Tanaka et al. | |
| 5,581,723 A | 12/1996 | Hasbun et al. | |
| 5,592,662 A | 1/1997 | Sawada et al. | |
| 5,592,669 A | 1/1997 | Robinson et al. | |
| 5,602,987 A | 2/1997 | Harari et al. | |
| 5,619,690 A | 4/1997 | Matsumani et al. | |
| 5,634,050 A | 5/1997 | Krueger et al. | |

(Continued)

FOREIGN PATENT DOCUMENTS

DE 10234971 A1 2/2004

(Continued)

OTHER PUBLICATIONS

Mei-Ling et al., "Managing Flash Memory in Personal Communication Device," IEEE, 1997, pp. 177-182.*

(Continued)

*Primary Examiner*—Shane M Thomas
(74) *Attorney, Agent, or Firm*—Davis Wright Tremaine LLP

(57) ABSTRACT

Host system data files are written directly to a large erase block flash memory system with a unique identification of each file and offsets of data within the file but without the use of any intermediate logical addresses or a virtual address space for the memory. Directory information of where the files are stored in the memory is maintained within the memory system by its controller, rather than by the host. A type of memory block is selected to receive additional data of a file that depends upon the types of blocks into which data of the file have already been written. Blocks containing data are selected for reclaiming any unused capacity therefrom by a process that selects blocks in order starting with those containing the least amount of valid data.

5 Claims, 24 Drawing Sheets

U.S. PATENT DOCUMENTS

| | | | |
|---|---|---|---|
| 5,737,742 A | 4/1998 | Achiwa et al. | |
| 5,774,397 A | 6/1998 | Endoh et al. | |
| 5,799,168 A | 8/1998 | Ban | |
| 5,809,558 A | 9/1998 | Matthews et al. | |
| 5,832,493 A | 11/1998 | Marshall et al. | |
| 5,867,641 A | 2/1999 | Jenett | |
| 5,896,393 A | 4/1999 | Yard et al. | |
| 5,907,854 A | 5/1999 | Kerns | |
| 5,928,347 A | 7/1999 | Jones | |
| 5,933,845 A * | 8/1999 | Kopp et al. | 711/103 |
| 5,933,846 A | 8/1999 | Endo | |
| 5,937,425 A | 8/1999 | Ban | |
| 5,966,720 A | 10/1999 | Itoh et al. | |
| 5,987,478 A | 11/1999 | See et al. | |
| 6,014,724 A | 1/2000 | Jenett | |
| 6,021,415 A | 2/2000 | Cannon et al. | |
| 6,038,636 A | 3/2000 | Brown, III et al. | |
| 6,046,935 A | 4/2000 | Takeuchi et al. | |
| 6,069,827 A | 5/2000 | Sinclair | |
| 6,145,069 A | 11/2000 | Dye | |
| 6,148,354 A | 11/2000 | Ban et al. | |
| 6,216,204 B1 | 4/2001 | Thiriet | |
| 6,226,728 B1 | 5/2001 | See et al. | |
| 6,256,690 B1 | 7/2001 | Carper | |
| 6,275,804 B1 | 8/2001 | Carl et al. | |
| 6,279,069 B1 | 8/2001 | Robinson et al. | |
| 6,347,355 B1 | 2/2002 | Kondo et al. | |
| 6,373,746 B1 | 4/2002 | Takeuchi et al. | |
| 6,374,324 B2 | 4/2002 | Han | |
| 6,385,690 B1 | 5/2002 | Iida et al. | |
| 6,401,160 B1 | 6/2002 | See et al. | |
| 6,412,040 B2 | 6/2002 | Hasbun et al. | |
| 6,426,893 B1 | 7/2002 | Conley et al. | |
| 6,446,140 B1 | 9/2002 | Nozu | |
| 6,456,528 B1 | 9/2002 | Chen | |
| 6,467,015 B1 | 10/2002 | Nolan et al. | |
| 6,467,021 B1 | 10/2002 | Sinclair | |
| 6,477,616 B1 | 11/2002 | Takahashi | |
| 6,480,935 B1 | 11/2002 | Carper et al. | |
| 6,484,937 B1 | 11/2002 | Devaux et al. | |
| 6,490,649 B2 | 12/2002 | Sinclair | |
| 6,493,811 B1 | 12/2002 | Blades et al. | |
| 6,522,580 B2 | 2/2003 | Chen et al. | |
| 6,535,949 B1 | 3/2003 | Parker | |
| 6,542,407 B1 | 4/2003 | Chen et al. | |
| 6,547,150 B1 | 4/2003 | Deo et al. | |
| 6,567,307 B1 | 5/2003 | Estakhri | |
| 6,598,114 B2 | 7/2003 | Funakoshi | |
| 6,604,168 B2 | 8/2003 | Ogawa | |
| 6,668,336 B2 | 12/2003 | Lasser | |
| 6,681,239 B1 | 1/2004 | Munroe et al. | |
| 6,763,424 B2 | 7/2004 | Conley | |
| 6,766,432 B2 | 7/2004 | Saltz | |
| 6,771,536 B2 | 8/2004 | Li et al. | |
| 6,772,955 B2 | 8/2004 | Yoshimoto et al. | |
| 6,779,063 B2 | 8/2004 | Yamamoto | |
| 6,781,877 B2 | 8/2004 | Cernea et al. | |
| 6,823,417 B2 | 11/2004 | Spencer | |
| 6,834,331 B1 | 12/2004 | Liu | |
| 6,886,083 B2 | 4/2005 | Murakami | |
| 6,895,464 B2 | 5/2005 | Chow et al. | |
| 6,898,662 B2 | 5/2005 | Gorobets | |
| 6,925,007 B2 | 8/2005 | Harari et al. | |
| 6,938,116 B2 | 8/2005 | Kim et al. | |
| 7,032,065 B2 | 4/2006 | Gonzalez et al. | |
| 7,092,911 B2 | 8/2006 | Yokota et al. | |
| 7,450,420 B2 | 11/2008 | Sinclair et al. | |
| 2002/0013879 A1 * | 1/2002 | Han | 711/103 |
| 2002/0099904 A1 | 7/2002 | Conley | |
| 2002/0194451 A1 | 12/2002 | Mukaida et al. | |
| 2003/0088812 A1 | 5/2003 | Lasser | |
| 2003/0109093 A1 | 6/2003 | Harari et al. | |
| 2003/0147278 A1 | 8/2003 | Tanaka et al. | |
| 2003/0229753 A1 | 12/2003 | Hwang | |
| 2003/0229769 A1 | 12/2003 | Montemayor | |
| 2004/0019716 A1 | 1/2004 | Bychkov et al. | |
| 2004/0073727 A1 | 4/2004 | Moran et al. | |
| 2004/0103241 A1 | 5/2004 | Chang et al. | |
| 2004/0157638 A1 | 8/2004 | Moran et al. | |
| 2004/0177212 A1 | 9/2004 | Chang et al. | |
| 2004/0248612 A1 | 12/2004 | Lee et al. | |
| 2005/0141312 A1 | 6/2005 | Sinclair et al. | |
| 2005/0141313 A1 | 6/2005 | Gorobets et al. | |
| 2005/0144357 A1 | 6/2005 | Sinclair | |
| 2005/0144358 A1 | 6/2005 | Conley et al. | |
| 2005/0144360 A1 | 6/2005 | Bennett et al. | |
| 2005/0144363 A1 | 6/2005 | Sinclair | |
| 2005/0144365 A1 | 6/2005 | Gorobets et al. | |
| 2005/0144367 A1 | 6/2005 | Sinclair | |
| 2005/0144516 A1 | 6/2005 | Gonzalez et al. | |
| 2005/0166087 A1 | 7/2005 | Gorobets | |
| 2006/0020744 A1 | 1/2006 | Sinclair et al. | |
| 2006/0020745 A1 | 1/2006 | Conley et al. | |
| 2006/0031593 A1 | 2/2006 | Sinclair | |
| 2006/0101084 A1 * | 5/2006 | Kishi et al. | 707/200 |
| 2006/0149916 A1 | 7/2006 | Nase | |
| 2006/0155920 A1 | 7/2006 | Smith et al. | |
| 2006/0155921 A1 | 7/2006 | Gorobets et al. | |
| 2006/0155922 A1 | 7/2006 | Gorobets et al. | |
| 2006/0161724 A1 | 7/2006 | Bennett et al. | |
| 2006/0161728 A1 | 7/2006 | Bennett et al. | |
| 2006/0168395 A1 | 7/2006 | Deng et al. | |
| 2006/0184718 A1 | 8/2006 | Sinclair et al. | |
| 2006/0184719 A1 | 8/2006 | Sinclair | |
| 2006/0184720 A1 | 8/2006 | Sinclair et al. | |
| 2006/0184722 A1 | 8/2006 | Sinclair | |
| 2006/0184723 A1 | 8/2006 | Sinclair et al. | |
| 2007/0030734 A1 | 2/2007 | Sinclair et al. | |
| 2007/0033323 A1 | 2/2007 | Gorobets | |
| 2007/0033324 A1 | 2/2007 | Sinclair | |
| 2007/0033326 A1 | 2/2007 | Sinclair | |
| 2007/0033328 A1 | 2/2007 | Sinclair et al. | |
| 2007/0033329 A1 | 2/2007 | Sinclair et al. | |
| 2007/0033331 A1 | 2/2007 | Sinclair et al. | |
| 2007/0033332 A1 | 2/2007 | Sinclair et al. | |
| 2007/0033374 A1 | 2/2007 | Sinclair et al. | |
| 2007/0033375 A1 | 2/2007 | Sinclair et al. | |
| 2007/0033376 A1 | 2/2007 | Sinclair et al. | |
| 2007/0033377 A1 | 2/2007 | Sinclair et al. | |
| 2007/0033378 A1 | 2/2007 | Sinclair et al. | |
| 2007/0086260 A1 | 4/2007 | Sinclair | |
| 2007/0088904 A1 | 4/2007 | Sinclair | |
| 2007/0186032 A1 | 8/2007 | Sinclair et al. | |

FOREIGN PATENT DOCUMENTS

| | | |
|---|---|---|
| EP | 0 852 765 B1 | 9/2001 |
| EP | 1100001 B1 | 8/2003 |
| EP | 1 571 557 A1 | 9/2005 |
| JP | 62-283496 A | 12/1987 |
| JP | 2002-251310 A | 9/2002 |
| JP | 2005-122439 A | 5/2005 |
| WO | WO 00/49488 A1 | 8/2000 |
| WO | WO 02/29575 A2 | 4/2002 |
| WO | WO 2004/012027 A2 | 2/2004 |
| WO | WO 2004/040453 A2 | 5/2004 |
| WO | WO 2004/040455 A2 | 5/2004 |
| WO | WO 2004/046937 A1 | 6/2004 |
| WO | WO 2005/066793 A1 | 7/2005 |

OTHER PUBLICATIONS

Rankl, Wolfgang et al., "Smart Card Handbook, Third Edition (translated by Kenneth Cox)", John Wiley & Sons, Ltd., 2004, pp. 52-93, 233-369, and 435-490.

Ban, Amir, "Inside Flash File Systems—Part I", IC Card Systems & Design, Jul./Aug. 1993, pp. 15-16, 18.

Ban, Amir, "Inside Flash File Systems—Part II", IC Card Systems & Design, Sep./Oct. 1993, pp. 21-24.

Intel AP-686 Application Note, "Flash File System Selection Guide," Dec. 1998, 18 pages.

Ban, Amir, "Local Flash Disks: Two Architectures Compared," M-Systems Flash Disk Pioneers, White Paper, Rev. 1.0, Aug. 2001, 9 pages.

Kim, Han-Joon et al., "A New Flash Memory Management for Flash Storage System", Computer Software and Applications Conference, 1999. Compsac '99 Proceedings. IEEE Comput. Soc., pp. 284-289.

Notification of Transmittal of the International Search Report and the Written Opinion of the International Searching Authority, or the Declaration, in corresponding PCT/US2006/030026, dated Nov. 28, 2006, 13 pages.

Chiang et al., "Cleaning Policies in Mobile Computers Using Flash Memory," *Journal of Systems & Software*, vol. 48, 1999, pp. 213-231.

Imamiya et al., "A 125-mm2 1-Gb NAND Flash Memory with 10-Mbyte/s Program Speed" Nov. 2002, IEEE Journal of Solid-State Circuits, vol. 37, No. 11, pp. 1493-1501.

Kjelso et al., "Memory Management in Flash-Memory Disks with Data Compression," 1995, Springer-Verlag, pp. 399-413.

Kim et al., "A Space-Efficient Flash Translation Layer for CompactFlash Systems," *IEEE Transactions on Consumer Electronics*, vol. 48, No. 2, May 2002, pp. 366-375.

Lim et al., "An Efficient NAND Flash File System for Flash Memory Storage," *IEEE Transactions on Computer*, vol. 55, No. 7, Jul. 1, 2006, pp. 906-912.

PNY Technologies Attache Flash Product, http://web.archive.org/web/20030704092223/http://www.pny.com/products/flash/attache.asp.07/04/2003. pp. 1-2.

USPTO, "Office Action," mailed in related U.S. Appl. No. 11/382,232 on Jun. 4, 2007, 14 pages.

USPTO, "Office Action," for U.S. Appl. No. 11/382,232 mailed Jan. 8, 2008, 8 pages.

Chiang, Mei-Ling et al., "Data Management in a Flash Memory Based Storage Server", National Chiao-Tung University, Hsinchu, Taiwan, Dept. of Computer and Information Science, 8 pages. Retrived from the Internet URL: http://citeseer.nj.nec.com/11056.html, Nov. 17, 2006, 8 pages.

Wu et al., "eNVy: A Non-Volatile, Main Memory Storage System," *ACM Sigplan Notices*, vol. 29, No. 11, Nov. 1, 1994, pp. 86-97.

USPTO, "Office Action," mailed in related U.S. Appl. No. 11/259,260 on Jan. 22, 2008, 37 pages.

USPTO, "Office Action," mailed in related U.S. Appl. No. 11/459,268 on Jan. 22, 2008, 37 pages.

USPTO, "Notice of Allowance and Fee(s) Due," mailed in related U.S. Appl. No. 11/382,232 on Jul. 17, 2008, 16 pages.

USPTO, "Notice of Allowance and Fee(s) Due," mailed in related U.S. Appl. No. 11/459,260 on Feb. 18, 2009, 62 pages.

USPTO, "Office Action," mailed in related U.S. Appl. No. 11/459,268 on Sep. 8, 2008, 31 pages.

USPTO, "Office Action," mailed in related U.S. Appl. No. 11/259,260 on Sep. 9, 2008, 26 pages.

EPO, "Examiner's Report," corresponding European Patent Application No. 06 789 157.2, mailed on Aug. 5, 2008, 3 pages.

USPTO, "Notice of Allowance and Fee(s) Due," mailed in related U.S. Appl. No. 11/459,268 on Mar. 3, 2009, 36 pages.

* cited by examiner

PRIOR ART SYSTEM

DIRECT DATA FILE STORAGE SYSTEM

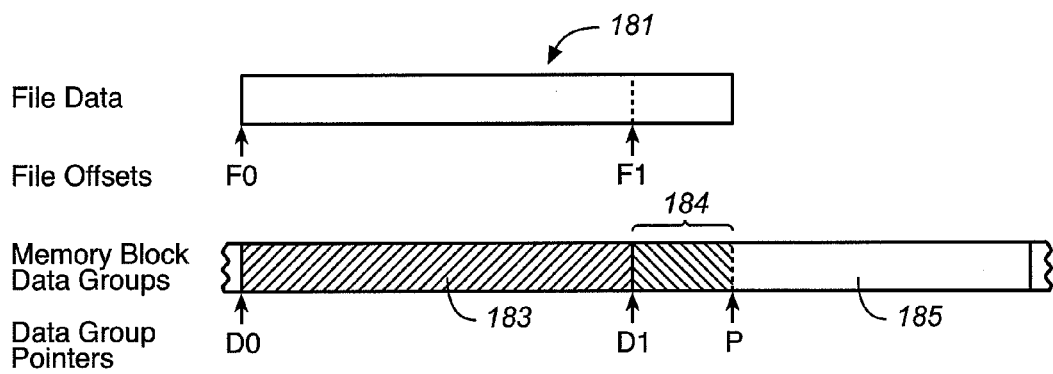
FIG. 13A Write
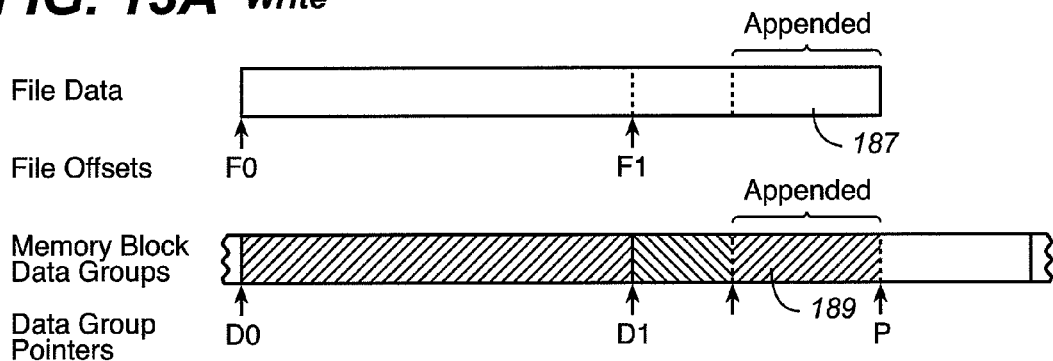
FIG. 13B Write
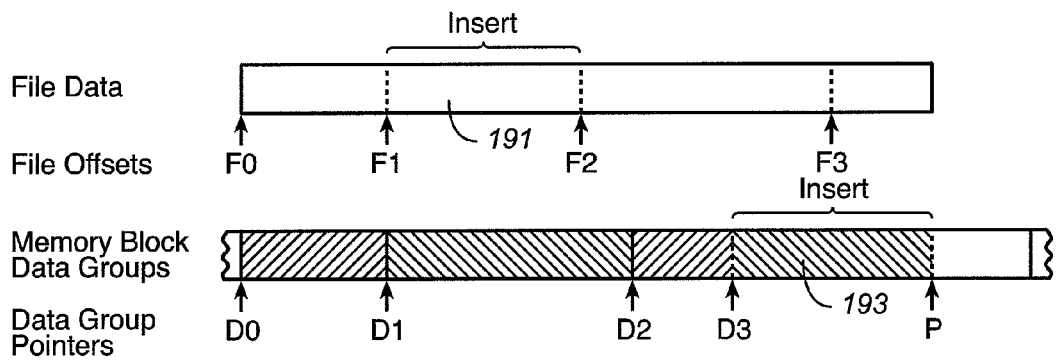
FIG. 13C Insert
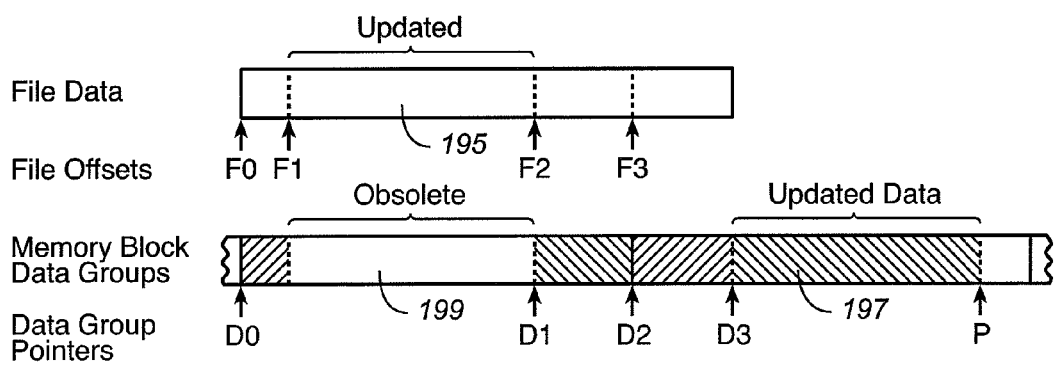
FIG. 13D Update

| State | Program Block | Common Block | Full Common Block | Full Program Block |
|---|---|---|---|---|
| 0 | | | | |
| 1 | | | | Full Program Block with Obsolete Data |
| 2 | Active Program Block | | | |
| 3 | | Active Common Block | | |
| 4 | Program Block | Active Common Block | | |
| 5 | | | Full Common Block | |
| 6 | | Two Common Blocks (One Active) | | |
| 7 | | Active Common Block | Full Common Block | |
| 8 | Active Program Block | | Full Common Block | |
| 9 | | | Two Full Common Blocks | |

| State Transition | Triggering Event | Description |
|---|---|---|
| 0 → 2 | Erased block allocated as the active block | An erased block is allocated as the active program block for programming data of unknown length for a new file or for a file whose data exists only in file blocks. |
| 0 → 3 | Partial block allocated as the active block | A partial block is selected from the partial block list as the best fit for programming data of known length for a new file or for a file whose data exists only in file blocks. It becomes the active common block for the file. |
| 1 → 0 | Data for file received for programming | Data for a file is received for programming, whose offset address is beyond the range of offset addresses that can be accommodated by a single block. The full program block is designated as a file block, and the file has no active block. |
| 1 → 2 | Full program block compacted | Data for a file is received for programming, whose offset address is within the range of offset addresses that can be accommodated by a single block. The full program block is compacted and remains the active program block for a file. |
| 2 → 0 | Active program block becomes full | The active program block for a file has become full and is designated as a file block. The file then has no active block. |
| 2 → 1 | Active program block becomes full | The active program block for a file has become full and contains some obsolete data. The range of offset addresses that exist for the file can be accommodated by a single block. The block is not immediately designated as a file block. |
| 2 → 3 | Active program block becomes reclaim destination | The active program block for a file is selected from the partial block list as the best fit for programming data of known length which is being moved from a reclaim block during a reclaim operation. It becomes the active common block for the file. |

| | | |
|---|---|---|
| 2 → 4 | Partial block allocated as the active block | A partial block is selected from the partial block list as the best fit for programming data of known length which is being moved from the program block for a file during a reclaim operation. The partial block becomes an active common block for the file. |
| 3 → 2 | Erased block allocated as the active block | An erased block is allocated for programming data of known length which is being moved from the common block for a file during a reclaim operation, when a partial block is not available. Allocation of the erased block would create a file state that is not permitted. The state transition therefore must incorporate a data transition, in which all data for the file is moved from the common block to the block that has been allocated, which then becomes the active program block for the file. The data transition must be completed as a single operation before the state transition can be considered complete. |
| 3 → 5 | Active common block becomes full | The active common block for a file has become full and is designated a full common block. The file then has no active block. |
| 3 → 6 | Partial block allocated as the active block | A partial block is selected from the partial block list as the best fit for programming data of known length which is being moved from the common block for a file during a reclaim operation. It becomes the active common block for the file. |
| 4 → 3 | Copying of data from program block complete | Data that is being moved from the program block for a file during a reclaim operation has been fully copied to a common block. The file then has no program block, and the common block remains the active block for the file. |
| 4 → 7 | Active common block becomes full | The active common block for a file has become full and is designated a full common block. The file already contains two fractal blocks, and another cannot be allocated. The state transition therefore requires a data transition, in which a partial block is allocated to which the remaining data from the program block that is being reclaimed is moved. This data transition is completed as a single operation. |
| 4 → 8 | Active common block becomes full | The active common block for a file has become full and is designated a full common block. The file already contains two fractal blocks, and another cannot be allocated. The state transition therefore requires a data transition, in which an erased block is allocated to which the remaining data from the program block that is being reclaimed is moved. This data transition is completed as a single operation before the state transition is complete. |
| 5 → 7 | Partial block allocated as the active block | A partial block is selected from the partial block log as the best fit for programming data of known length for a new file or for a file whose data exists only in file blocks. It becomes the active common block for the file. |
| 5 → 8 | Erased block allocated as the active block | An erased block is allocated as the active program block for programming data of unknown length for a new file or for a file whose data exists only in file blocks. |

FIG. 17B

| | | | |
|---|---|---|---|
| 6 → 7 | Active common block becomes full | The active common block for a file has become full and is designated a full common block. The file already contains two fractal blocks, and another cannot be allocated. The state transition therefore must incorporate a data transition, in which a partial block is allocated to which the remaining data for the file from the common block that is being reclaimed is moved. This partial block then becomes the active common block for the file. The data transition must be completed as a single operation before the state transition can be considered complete. | |
| 6 → 8 | Active common block becomes full | The active common block for a file has become full and is designated a full common block. The file already contains two fractal blocks, and another cannot be allocated. The state transition therefore must incorporate a data transition, in which an erased block is allocated to which the remaining data for the file from the common block that is being reclaimed is moved. This erased block then becomes the active program block for the file. The data transition must be completed as a single operation before the state transition can be considered complete. | |
| 7 → 7 | Common block designated as reclaim block, and data for file should be relocated | A common block for a file has become the reclaim block and data for the file must be relocated. The file already contains two fractal blocks, and another cannot be allocated. The state transition therefore must incorporate a data transition, in which a partial block is selected from the partial block list and the remaining data for the file from the common block that is being reclaimed is moved to it. This partial block then becomes the active common block for the file. The data transition must be completed as a single operation before the state transition can be considered complete. | |
| 7 → 8 | Common block designated as reclaim block, and data for file should be relocated | A common block for a file has become the reclaim block and data for the file must be relocated. The file already contains two fractal blocks, and another cannot be allocated. The state transition therefore must incorporate a data transition, in which an erased block is selected because a partial block is not available. The remaining data for the file from the common block that is being reclaimed is moved to the erased block, which becomes the active program block for the file. The data transition must be completed as a single operation before the state transition can be considered complete. | |
| 7 → 9 | Active common block becomes full | An active common block for a file has become full and is designated a second full common block. The file then has no active block. | |
| 8 → 5 | Active program block becomes full | An active program block for a file has become full and is designated as a file block. The file then has no active block. | |
| 8 → 7 | Case 1<br><br>Active program block becomes reclaim destination | The active program block for a file is selected from the partial block list as the best fit for programming data of known length which is being moved from a reclaim block during a reclaim operation. It becomes the active common block for the file. | |

|  | FIG. 19A |
| --- | --- |
|  | FIG. 19B |

FIG. 19A

| State Transition | Description |
| --- | --- |
| 2 → 0 | All data for the file in the program block has become obsolete. |
| 3 → 0 | All data for the file in the common block has become obsolete. |
| 3 → 2 | All data for other files in the common block has become obsolete. The common block becomes a program block. |
| 4 → 2 | Case 1<br>All data for the file in the common block has become obsolete. |
| 4 → 2 | Case 2<br>All data for other files in the common block has become obsolete. The common block becomes a program block. Since there is no permitted state with two program blocks, data from the two blocks must be consolidated into one program block, or one file block plus one program block. This data transition must be completed as a single operation before the state transition can be considered complete. |
| 4 → 3 | All data for the file in the program block has become obsolete. |
| 5 → 0 | Case 1<br>All data for the file in the full common block has become obsolete. |
| 5 → 0 | Case 2<br>All data for other files in the full common block has become obsolete. The full common block becomes a file block. |
| 6 → 3 | All data for the file in one common block has become obsolete. |
| 6 → 4 | All data for other files in one common block has become obsolete. The common block becomes a program block. |
| 7 → 3 | Case 1<br>All data for the file in the full common block has become obsolete. |
| 7 → 3 | Case 2<br>All data for other files in the full common block has become obsolete. The full common block becomes a file block. |
| 7 → 5 | All data for the file in the common block has become obsolete. |
| 7 → 8 | All data for other files in the common block has become obsolete. The common block becomes a program block. |

| Existing File State | Prevailing Condition that Necessitates Allocation of a New Active Block | Order of Priority for Type of Block that Should be Allocated as a New Active Block |
|---|---|---|
| 0 | Data of unknown length to be provided from host | 1. Erased block |
| 0 | Data of known length less than a block to be provided from host | 1. Best fit partial block<br>2. Erased block |
| 1 | Data of any length to be provided from host | 1. Compacted full program block |
| 2 | Data of known length to be relocated from program block | 1. Best fit partial block<br>2. Biggest partial block<br>3. Erased block |
| 3 | Data of known length to be relocated from common block | 1. Best fit partial block<br>2. Biggest partial block<br>3. Erased block<br>Data relocated from common block to erased block immediately as a single operation |
| 4 | Data of known length to be relocated from program block | 1. Best fit partial block<br>2. Erased block<br>Data relocated from program block immediately as a single operation |
| 5 | Data of unknown length to be provided from host | 1. Erased block |
| 5 | Data of known length less than a block to be provided from host | 1. Best fit partial block<br>2. Erased block |
| 6 | Data of known length to be relocated from common block | 1. Best fit partial block<br>2. Erased block<br>Data relocated from common block immediately as a single operation |

| 7 | Data of known length to be relocated from common block | 1. Best fit partial block<br>2. Erased block<br>Data relocated from common block immediately as a single operation |
|---|---|---|
| 8 | Data of known length to be relocated from program block | 1. Best fit partial block<br>2. Erased block<br>Data relocated from program block immediately as a single operation |
| 9 | Data of known length to be relocated from full common block | 1. Erased block<br>2. Best fit partial block<br>Data relocated from full common block immediately as a single operation |

*FIG. 20B*

| Block Type | Block Contents | | | Block List |
|---|---|---|---|---|
| | Valid Data (V) | Erased Capacity (E) | Obsolete Data (O) | |
| Program | Yes | Yes | Don't Care | Partial |
| Common | Yes | Yes | Don't Care | Partial |
| Full Common | Yes | No | No | None |
| | | | Yes | Obsolete |
| File | Yes | No | No | None |
| | | | Yes | Obsolete |
| Invalid | No | Yes | Yes | Obsolete |
| Erased | No | Yes | No | Erased |

RECLAIMING DATA STORAGE CAPACITY IN FLASH MEMORY SYSTEMS

CROSS-REFERENCE TO RELATED APPLICATIONS

The benefit is claimed of U.S. provisional patent application of Alan W. Sinclair and Barry Wright, Ser. No. 60/705,388, filed Aug. 3, 2005.

This application is also related to U.S. patent application Ser. Nos. 11/060,174, 11/060,248 and 11/060,249, all filed on Feb. 16, 2005, naming as inventors either Alan W. Sinclair alone or with Peter J. Smith.

This application is also related to three U.S. patent applications of Alan W. Sinclair and Barry Wright, entitled "Management of Memory Blocks That Directly Store Data Files," "Memory System With Management of Memory Blocks That Directly Store Data Files," "Reclaiming Data Storage Capacity in Flash Memories," and to two provisional applications by them entitled "File Data Indexing in Flash Memory" and "Content Addressable Lists in Flash Memory," all being filed concurrently herewith.

GENERAL BACKGROUND

This application relates to the operation of re-programmable non-volatile memory systems such as semiconductor flash memory, and, more specifically, to the management of the interface between a host device and the memory.

There are two primary techniques by which data communicated through external interfaces of host systems, memory systems and other electronic systems are addressed. In one of them, addresses of data files generated or received by the system are mapped into distinct ranges of a continuous logical address space established for the system. The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive. In the second of the two techniques, data files generated or received by an electronic system are uniquely identified and their data logically addressed by offsets within the file. A form of this addressing method is used between computers or other host systems and a removable memory card known as a "Smart Card." Smart Cards are typically used by consumers for identification, banking, point-of-sale purchases, ATM access and the like.

In an early generation of commercial flash memory systems, a rectangular array of memory cells were divided into a large number of groups of cells that each stored the amount of data of a standard disk drive sector, namely 512 bytes. An additional amount of data, such as 16 bytes, are also usually included in each group to store an error correction code (ECC) and possibly other overhead data relating to the user data and/or to the memory cell group in which the associated user data are stored. The memory cells in each such group are the minimum number of memory cells that are erasable together. That is, the erase unit is effectively the number of memory cells that store one data sector and any overhead data that is included. Examples of this type of memory system are described in U.S. Pat. Nos. 5,602,987 and 6,426,893. It is a characteristic of flash memory that the memory cells are erased prior to re-programming them with data.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In later generations of flash memory systems, the size of the erase unit was increased to a block of enough memory cells to store multiple sectors of data. Even though host systems with which the memory systems are connected may program and read data in small minimum units such as sectors, a large number of sectors are stored in a single erase unit of the flash memory. It is common for some sectors of data within a block to become obsolete as the host updates or replaces logical sectors of data. Since the entire block must be erased before any data stored in the block can be overwritten, new or updated data are typically stored in another block that has been erased and has remaining capacity for the data. This process leaves the original block with obsolete data that take valuable space within the memory. But that block cannot be erased if there are any valid data remaining in it.

Therefore, in order to better utilize the memory's storage capacity, it is common to consolidate or collect valid partial block amounts of data by copying them into an erased block so that the block(s) from which these data are copied may then be erased and their entire storage capacity reused. It is also desirable to copy the data in order to group data sectors within a block in the order of their logical addresses since this increases the speed of reading the data and transferring the read data to the host. If such data copying occurs too frequently, the operating performance of the memory system can be degraded. This particularly affects operation of memory systems where the storage capacity of the memory is little more than the amount of data addressable by the host through the logical address space of the system, a typical case. In this case, data consolidation or collection may be required before a host programming command can be executed. The programming time is then increased as a result.

The sizes of the blocks have been increasing in successive generations of memory systems in order to increase the number of bits of data that may be stored in a given semiconductor area. Blocks storing 256 data sectors and more are becoming common. Additionally, two, four or more blocks of different arrays or sub-arrays are often logically linked together into metablocks in order to increase the degree of parallelism in data programming and reading. Along with such large capacity operating units come challenges in operating them efficiently.

A common host interface for such memory systems is a logical address interface similar to that commonly used with disk drives. Files generated by a host to which the memory is connected are assigned unique addresses within the logical address space of the interface. The memory system then commonly maps data between the logical address space and the physical blocks or metablocks of the memory. The memory system keeps track of how the logical address space is mapped into the physical memory but the host is unaware of this. The host keeps track of the addresses of its data files within the logical address space but the memory system operates without knowledge of this mapping.

SUMMARY OF THE INVENTION

Many techniques have been developed that overcome to various degrees certain of the problems encountered in efficiently operating such large erase block flash memory systems. The present invention, on the other hand, is based upon a fundamental change, namely by changing the data transfer interface between the memory and the host system. Rather than communicating data between them by the use of logical addresses within a virtual address space, a data file is identified by a filename assigned by the host and its accessed by offset address within the file. The memory system then knows the host file to which each sector or other unit of data belongs. The file unit being discussed herein is a set of data that is ordered, such as by having sequential offset addresses, and which is created and uniquely identified by an application program operating in a host computing system.

This is not employed by most current commercial memory systems since hosts now identify data to the memory system within all files by a common set of logical addresses without identifying the files. By identifying host data by file objects instead of using logical addresses, the memory system controller can store the data in a manner that reduces the need for such frequent data consolidation and garbage collection. The frequency of data copy operations and the amount of data copied are thus significantly reduced, thereby increasing the data programming and reading performance of the memory system. Further, the memory system controller maintains directory and index table information of the memory blocks into which host files are stored. It is then unnecessary for the host to maintain the file allocation table (FAT) that is currently necessary for managing a logical address interface.

Block reclaim operations include garbage collection and data consolidation, wherein, in general, valid data of underutilized blocks are gathered together in other blocks and the underutilized blocks are then erased and made available for accepting new data. In accordance with an aspect of the present invention, blocks of memory cells are selected to be reclaimed on the basis of the content of the blocks. In memory systems utilizing a logical address interface, a block of memory cells is typically reclaimed in response to the host closing a logical data block that is mapped into the physical block, not on the basis of the content of the physical block. By including block content in the selection criteria, more efficient operation of the memory system is made possible.

In specific embodiments, blocks partially filled with valid data are chosen for a reclaim operation based on the amount of valid data contained in them. Blocks with the least amount of valid data can be reclaimed most efficiently since there is less data to be copied to another block. Since the copying of data takes a significant amount of time away from other memory operations, such as data programming or reading, the selection of a block for reclaim that has the least amount of valid data, for example, means that this block can be made available for the storage of new data with the least negative effect on system performance. Since some blocks containing a small amount of valid data also contain some erased capacity into which data may be written without having to reclaim the block, some embodiments include taking the amount of erased capacity in the blocks into consideration when selecting a block to be reclaimed. If two blocks have the same amount of valid data stored in them but one has some erased capacity and the other does not, for example, the block without the erased capacity is reclaimed first since there is more to be gained. The block with erased capacity has current value for the storage of new data, depending on the amount of data that can be written into it, while the block without erased capacity does not.

Other aspects, advantages, features and details of the present invention are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 13A-13D show four different examples of writing data of files directly into the memory;

FIG. 20 is a summary table listing the types of blocks allocated as active blocks under conditions of FIGS. 15-20;

FLASH MEMORY SYSTEM GENERAL DESCRIPTION

A common flash memory system and a typical operation with host devices are described with respect to FIGS. 1-8. It is in such a system that the various aspects of the present invention may be implemented. A host system 1 of FIG. 1 stores data into and retrieves data from a flash memory 2. Although the flash memory can be embedded within the host, the memory 2 is illustrated to be in the more popular form of a card that is removably connected to the host through mating parts 3 and 4 of a mechanical and electrical connector. There are currently many different flash memory cards that are commercially available, examples being those sold under trademarks CompactFlash (CF), the MultiMediaCard (MMC), Secure Digital (SD), miniSD, microSD, Memory Stick, SmartMedia and TransFlash. Although these cards have unique mechanical and/or electrical interfaces according to their standardized specifications, the flash memory included in each is very similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that use such memory cards and flash drives are many and varied. They include personal computers (PCs), laptop and other portable computers, cellular telephones, personal digital assistants (PDAs), digital still cameras, digital movie cameras and portable audio players. The host typically includes a built-in receptacle for one or more types of memory cards or flash drives but some require adapters into which a memory card is plugged. The memory system usually contains its own memory controller and drivers but there are also some memory only systems that are instead controlled by software executed by the host to which the memory is connected. In some memory systems containing the controller, especially those embedded within a host, the memory, controller and drivers are often formed on a single integrated circuit chip.

Figure 1:
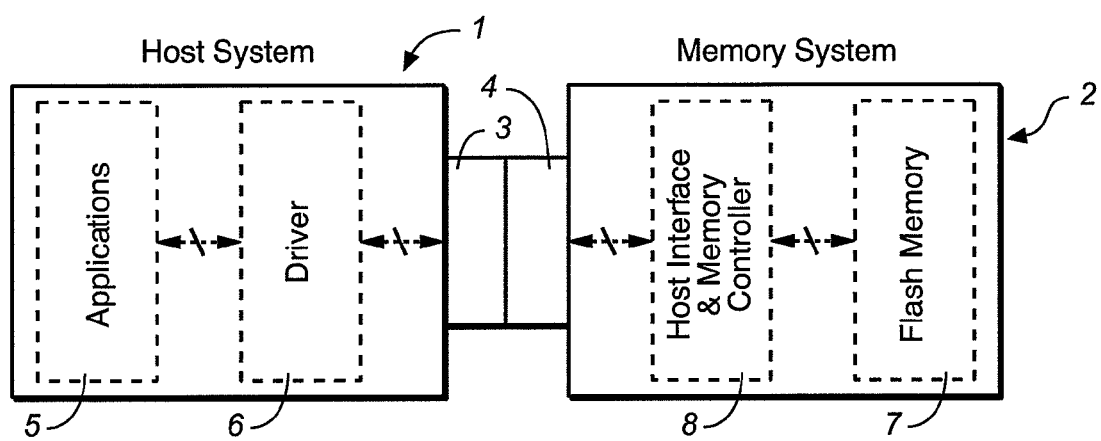
FIG. 1 schematically illustrates a host and a connected non-volatile memory system as currently implemented.

The host system 1 of FIG. 1 may be viewed as having two major parts, insofar as the memory 2 is concerned, made up of a combination of circuitry and software. They are an applications portion 5 and a driver portion 6 that interfaces with the memory 2. In a personal computer, for example, the applications portion 5 can include a processor running word processing, graphics, control or other popular application software. In a camera, cellular telephone or other host system that is primarily dedicated to performing a single set of functions, the applications portion 5 includes the software that operates the camera to take and store pictures, the cellular telephone to make and receive calls, and the like.

The memory system 2 of FIG. 1 includes flash memory 7, and circuits 8 that both interface with the host to which the card is connected for passing data back and forth and control the memory 7. The controller 8 typically converts between logical addresses of data used by the host 1 and physical addresses of the memory 7 during data programming and reading.

Figure 2:
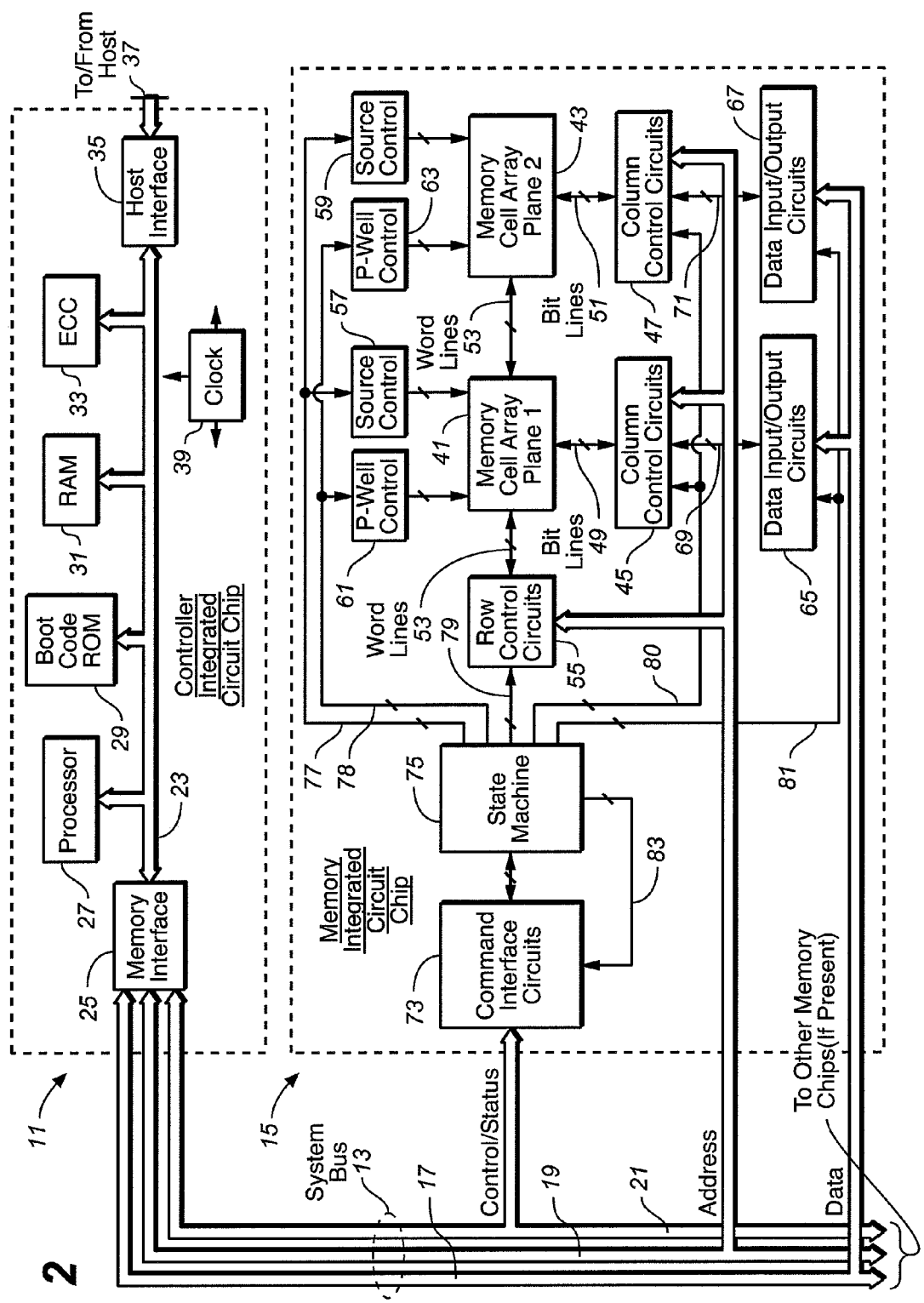
FIG. 2 is a block diagram of an example flash memory system for use as the non-volatile memory of FIG. 1.

Referring to FIG. 2, circuitry of a typical flash memory system that may be used as the non-volatile memory 2 of FIG. 1 is described. The system controller is usually implemented on a single integrated circuit chip 11 that is connected in parallel with one or more integrated circuit memory chips over a system bus 13, a single such memory chip 15 being shown in FIG. 2. The particular bus 13 that is illustrated includes a separate set of conductors 17 to carry data, a set 19 for memory addresses and a set 21 for control and status signals. Alternatively, a single set of conductors may be time shared between these three functions. Further, other configurations of system buses can be employed, such as a ring bus that is described in U.S. patent application Ser. No. 10/915,039, filed Aug. 9, 2004, entitled "Ring Bus Structure and It's Use in Flash Memory Systems," now publication no. 2006/0031593 A1.

A typical controller chip 11 has its own internal bus 23 that interfaces with the system bus 13 through interface circuits 25. The primary functions normally connected to the bus are a processor 27 (such as a microprocessor or micro-controller), a read-only-memory (ROM) 29 containing code to initialize ("boot") the system, read-only-memory (RAM) 31 used primarily to buffer data being transferred between the memory and a host, and circuits 33 that calculate and check an error correction code (ECC) for data passing through the controller between the memory and the host. The controller bus 23 interfaces with a host system through circuits 35, which, in the case of the system of FIG. 2 being contained within a memory card, is done through external contacts 37 of the card that are part of the connector 4. A clock 39 is connected with and utilized by each of the other components of the controller 11.

The memory chip 15, as well as any other connected with the system bus 13, typically contains an array of memory cells organized into multiple sub-arrays or planes, two such planes 41 and 43 being illustrated for simplicity but more, such as four or eight such planes, may instead be used. Alternatively, the memory cell array of the chip 15 may not be divided into planes. When so divided however, each plane has its own column control circuits 45 and 47 that are operable largely independently of each other. The circuits 45 and 47 receive addresses of their respective memory cell array from the address portion 19 of the system bus 13, and decode them to address a specific one or more of respective bit lines 49 and 51. The word lines 53 are addressed through row control circuits 55 in response to addresses received on the address bus 19. Source voltage control circuits 57 and 59 are also connected with the respective planes, as are p-well voltage control circuits 61 and 63. If the memory chip 15 has a single array of memory cells, and if two or more such chips exist in the system, the array of each chip may be operated similarly to a plane or sub-array within the multi-plane chip described above.

Data are transferred into and out of the planes 41 and 43 through respective data input/output circuits 65 and 67 that are connected with the data portion 17 of the system bus 13. The circuits 65 and 67 provide for both programming data into the memory cells and for reading data from the memory cells of their respective planes, through lines 69 and 71 connected to the planes through respective column control circuits 45 and 47.

Although the controller 11 controls the operation of the memory chip 15 to program data, read data, erase and attend to various housekeeping matters, each memory chip also contains some controlling circuitry that executes commands from the controller 11 to perform such functions. Interface circuits 73 are connected to the control and status portion 21 of the system bus 13. Commands from the controller are provided to a state machine 75 that then provides specific control of other circuits in order to execute these commands. Control lines 77-81 connect the state machine 75 with these other circuits as shown in FIG. 2. Status information from the state machine 75 is communicated over lines 83 to the interface 73 for transmission to the controller 11 over the bus portion 21.

A NAND architecture of the memory cell arrays 41 and 43 is currently preferred, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and United States patent application publication no. 2003/0147278.

Figure 3:
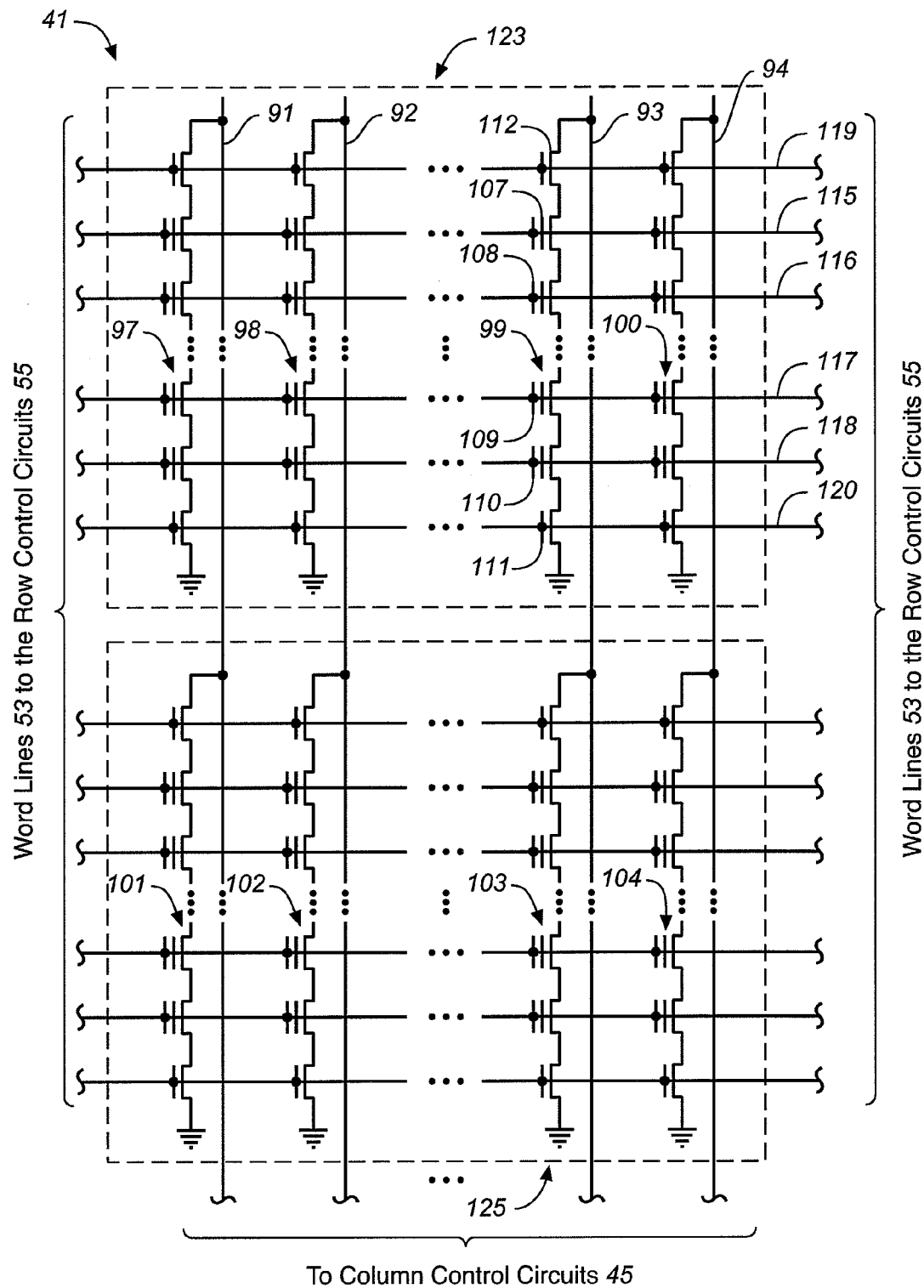
FIG. 3 is a representative circuit diagram of a memory cell array that may be used in the system of FIG. 2.

An example NAND array is illustrated by the circuit diagram of FIG. 3, which is a portion of the memory cell array 41 of the memory system of FIG. 2. A large number of global bit lines are provided, only four such lines 91-94 being shown in FIG. 2 for simplicity of explanation. A number of series connected memory cell strings 97-104 are connected between one of these bit lines and a reference potential. Using the memory cell string 99 as representative, a plurality of charge storage memory cells 107-110 are connected in series with select transistors 111 and 112 at either end of the string. When the select transistors of a string are rendered conductive, the string is connected between its bit line and the reference potential. One memory cell within that string is then programmed or read at a time.

Word lines 115-118 of FIG. 3 individually extend across the charge storage element of one memory cell in each of a number of strings of memory cells, and gates 119 and 120 control the states of the select transistors at each end of the strings. The memory cell strings that share common word and control gate lines 115-120 are made to form a block 123 of memory cells that are erased together. This block of cells contains the minimum number of cells that are physically erasable at one time. One row of memory cells, those along one of the word lines 115-118, are programmed at a time. Typically, the rows of a NAND array are programmed in a prescribed order, in this case beginning with the row along the word line 118 closest to the end of the strings connected to ground or another common potential. The row of memory cells along the word line 117 is programmed next, and so on, throughout the block 123. The row along the word line 115 is programmed last.

A second block 125 is similar, its strings of memory cells being connected to the same global bit lines as the strings in the first block 123 but having a different set of word and control gate lines. The word and control gate lines are driven to their proper operating voltages by the row control circuits 55. If there is more than one plane or sub-array in the system, such as planes 1 and 2 of FIG. 2, one memory architecture uses common word lines extending between them. There can alternatively be more than two planes or sub-arrays that share common word lines. In other memory architectures, the word lines of individual planes or sub-arrays are separately driven.

As described in several of the NAND patents and published application referenced above, the memory system may be operated to store more than two detectable levels of charge in each charge storage element or region, thereby to store more than one bit of data in each. The charge storage elements of the memory cells are most commonly conductive floating gates but may alternatively be non-conductive dielectric charge trapping material, as described in United States patent application publication no. 2003/0109093.

Figure 4:
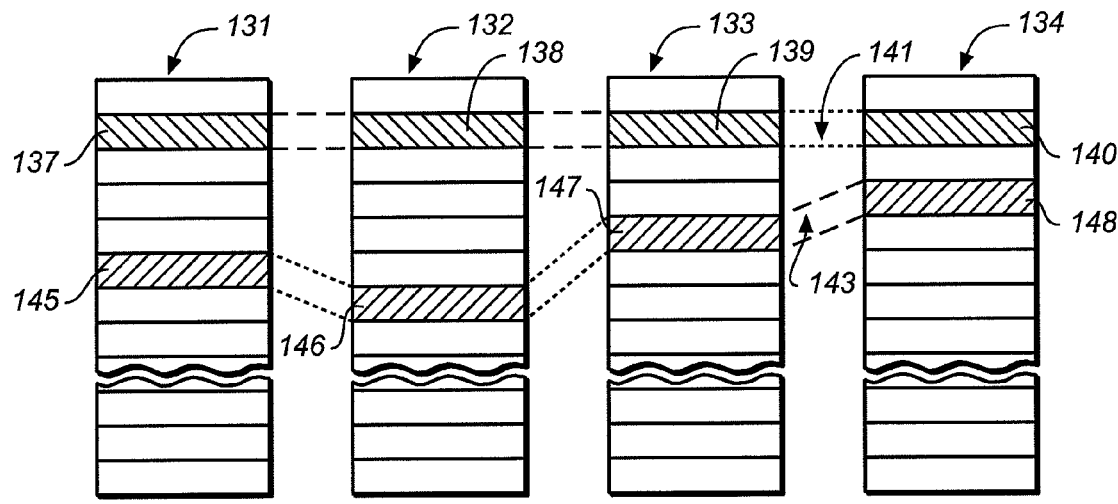
FIG. 4 illustrates an example physical memory organization of the system of FIG. 2.

FIG. 4 conceptually illustrates an organization of the flash memory cell array 7 (FIG. 1) that is used as an example in further descriptions below. Four planes or sub-arrays 131-134 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 4 by rectangles, such as blocks 137, 138, 139 and 140, located in respective planes 131-134. There can be dozens or hundreds of blocks in each plane. As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 137-140 are shown to form one metablock 141. All of the cells within a metablock are typically erased together. The blocks used to form a metablock need not be restricted to the same relative locations within their respective planes, as is shown in a second metablock 143 made up of blocks 145-148. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
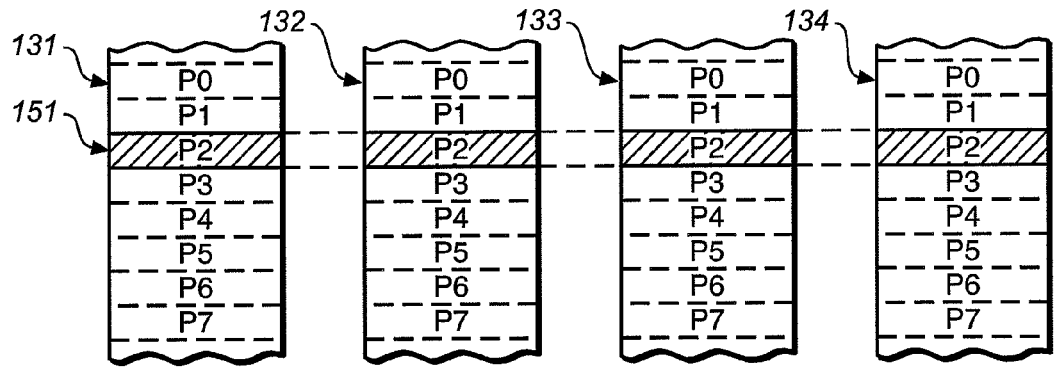
FIG. 5 shows an expanded view of a portion of the physical memory of FIG. 4.

The individual blocks are in turn divided for operational purposes into pages of memory cells, as illustrated in FIG. 5. The memory cells of each of the blocks 131-134, for example, are each divided into eight pages P0-P7. Alternatively, there may be 16, 32 or more pages of memory cells within each block. The page is the unit of data programming and reading within a block, containing the minimum amount of data that are programmed at one time. In the NAND architecture of FIG. 3, a page is formed of memory cells along a word line within a block. However, in order to increase the memory system operational parallelism, such pages within two or more blocks may be logically linked into metapages. A metapage 151 is illustrated in FIG. 5, being formed of one physical page from each of the four blocks 131-134. The metapage 151, for example, includes the page P2 in of each of the four blocks but the pages of a metapage need not necessarily have the same relative position within each of the blocks.

Although it is preferable to program and read the maximum amount of data in parallel across all four planes, for high system performance, the memory system can also be operated to form metapages of any or all of one, two or three pages in separate blocks in different planes. This allows the programming and reading operations to adaptively match the amount of data that may be conveniently handled in parallel and reduces the occasions when part of a metapage remains unprogrammed with data.

A metapage formed of physical pages of multiple planes, as illustrated in FIG. 5, contains memory cells along word line rows of those multiple planes. Rather than programming all of the cells in one word line row at the same time, they are more commonly alternately programmed in two or more interleaved groups, each group storing a page of data (in a single block) or a metapage of data (across multiple blocks). By programming alternate memory cells at one time, a unit of peripheral circuits including data registers and a sense amplifier need not be provided for each bit line but rather are time-shared between adjacent bit lines. This economizes on the amount of substrate space required for the peripheral circuits and allows the memory cells to be packed with an increased density along the rows. Otherwise, it is preferable to simultaneously program every cell along a row in order to maximize the parallelism available from a given memory system.

With reference to FIG. 3, the simultaneous programming of data into every other memory cell along a row is most conveniently accomplished by providing two rows of select transistors (not shown) along at least one end of the NAND strings, instead of the single row that is shown. The select transistors of one row then connect every other string within a block to their respective bit lines in response to one control signal, and the select transistors of the other row connect intervening every other string to their respective bit lines in response to another control signal. Two pages of data are therefore written into each row of memory cells.

Figure 6:
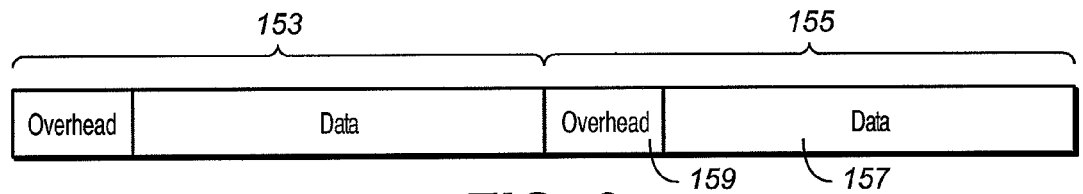
FIG. 6 shows a further expanded view of a portion of the physical memory of FIGS. 4 and 5.

The amount of data in each logical page is typically an integer number of one or more sectors of data, each sector containing 512 bytes of data, by convention. FIG. 6 shows a logical data page of two sectors 153 and 155 of data of a page or metapage. Each sector usually contains a portion 157 of 512 bytes of user or system data being stored and another number of bytes 159 for overhead data related either to the data in the portion 157 or to the physical page or block in which it is stored. The number of bytes of overhead data is typically 16 bytes, making the total 528 bytes for each of the sectors 153 and 155. The overhead portion 159 may contain an ECC calculated from the data portion 157 during programming, its logical address, an experience count of the number of times the block has been erased and re-programmed, one or more control flags, operating voltage levels, and/or the like, plus an ECC calculated from such overhead data 159. Alternatively, the overhead data 159, or a portion of it, may be stored in different pages in other blocks.

As the parallelism of memories increases, data storage capacity of the metablock increases and the size of the data page and metapage also increase as a result. The data page may then contain more than two sectors of data. With two sectors in a data page, and two data pages per metapage, there are four sectors in a metapage. Each metapage thus stores 2048 bytes of data. This is a high degree of parallelism, and can be increased even further as the number of memory cells in the rows are increased. For this reason, the width of flash memories is being extended in order to increase the amount of data in a page and a metapage.

Figure 7:
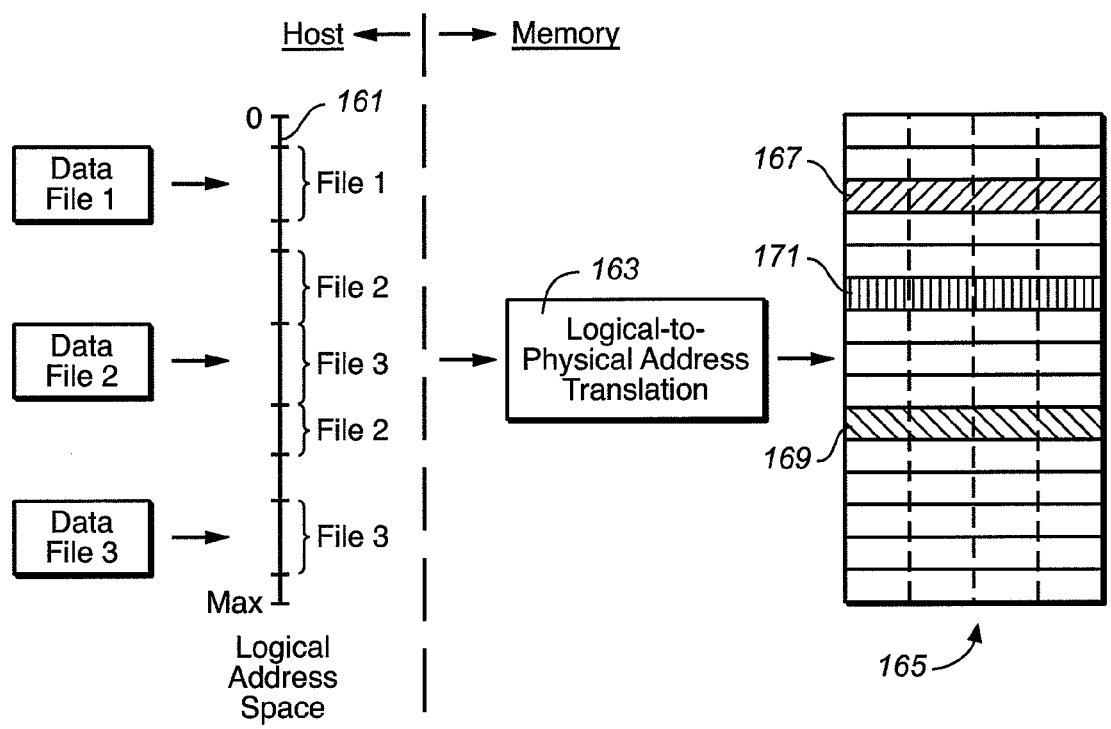
FIG. 7 illustrates a common prior art logical address interface between a host and a re-programmable memory system.

The physically small re-programmable non-volatile memory cards and flash drives identified above are commercially available with data storage capacity of 512 megabytes (MB), 1 gigabyte (GB), 2 GB and 4 GB, and may go higher. FIG. 7 illustrates the most common interface between a host and such a mass memory system. The host deals with data files generated or used by application software or firmware programs executed by the host. A word processing data file is an example, and a drawing file of computer aided design (CAD) software is another, found mainly in general computer hosts such as PCs, laptop computers and the like. A document in the pdf format is also such a file. A still digital video camera generates a data file for each picture that is stored on a memory card. A cellular telephone utilizes data from files on an internal memory card, such as a telephone directory. A PDA stores and uses several different files, such as an address file, a calendar file, and the like. In any such application, the memory card may also contain software that operates the host.

A common logical interface between the host and the memory system is illustrated in FIG. 7. A continuous logical address space 161 is large enough to provide addresses for all the data that may be stored in the memory system. The host address space is typically divided into increments of clusters of data. Each cluster may be designed in a given host system to contain a number of sectors of data, somewhere between 4 and 64 sectors being typical. A standard sector contains 512 bytes of data.

Three Files 1, 2 and 3 are shown in the example of FIG. 7 to have been created. An application program running on the host system creates each file as an ordered set of data and identifies it by a unique name or other reference. Enough available logical address space not already allocated to other files is assigned by the host to File 1. File 1 is shown to have been assigned a contiguous range of available logical addresses. Ranges of addresses are also commonly allocated for specific purposes, such as a particular range for the host operating software, which are then avoided for storing data even if these addresses have not been utilized at the time the host is assigning logical addresses to the data.

When a File 2 is later created by the host, the host similarly assigns two different ranges of contiguous addresses within the logical address space 161, as shown in FIG. 7. A file need not be assigned contiguous logical addresses but rather can be fragments of addresses in between address ranges already allocated to other files. This example then shows that yet another File 3 created by the host is allocated other portions of the host address space not previously allocated to the Files 1 and 2 and other data.

The host keeps track of the memory logical address space by maintaining a file allocation table (FAT), where the logical addresses assigned by the host to the various host files by the conversion 160 are maintained. The FAT table is frequently updated by the host as new files are stored, other files deleted, files modified and the like. The FAT table is typically stored in a host memory, with a copy also stored in the non-volatile memory that is updated from time to time. The copy is typically accessed in the non-volatile memory through the logical address space just like any other data file. When a host file is deleted, the host then deallocates the logical addresses previously allocated to the deleted file by updating the FAT table to show that they are now available for use with other data files.

The host is not concerned about the physical locations where the memory system controller chooses to store the files. The typical host only knows its logical address space and the logical addresses that it has allocated to its various files. The memory system, on the other hand, through a typical host/card interface, only knows the portions of the logical address space to which data have been written but does not know the logical addresses allocated to specific host files, or even the number of host files. The memory system controller converts the logical addresses provided by the host for the storage or retrieval of data into unique physical addresses within the flash memory cell array where host data are stored. A block 163 represents a working table of these logical-to-physical address conversions, which is maintained by the memory system controller.

The memory system controller is programmed to store data files within the blocks and metablocks of a memory array 165 in a manner to maintain the performance of the system at a high level. Four planes or sub-arrays are used in this illustration. Data are preferably programmed and read with the maximum degree of parallelism that the system allows, across an entire metablock formed of a block from each of the planes. At least one metablock 167 is usually allocated as a reserved block for storing operating firmware and data used by the memory controller. Another metablock 169, or multiple metablocks, may be allocated for storage of host operating software, the host FAT table and the like. Most of the physical storage space remains for the storage of data files. The memory controller does not know, however, how the data received has been allocated by the host among its various file objects. All the memory controller typically knows from interacting with the host is that data written by the host to specific logical addresses are stored in corresponding physical addresses as maintained by the controller's logical-to-physical address table 163.

In a typical memory system, a few extra blocks of storage capacity are provided than are necessary to store the amount of data within the address space 161. One or more of these extra blocks may be provided as redundant blocks for substitution for other blocks that may become defective during the lifetime of the memory. The logical grouping of blocks contained within individual metablocks may usually be changed for various reasons, including the substitution of a redundant block for a defective block originally assigned to the metablock. One or more additional blocks, such as metablock 171, are typically maintained in an erased block pool. When the host writes data to the memory system, the controller converts the logical addresses assigned by the host to physical addresses within a metablock in the erased block pool. Other metablocks not being used to store data within the logical address space 161 are then erased and designated as erased pool blocks for use during a subsequent data write operation. In a preferred form, the logical address space is divided into logical groups that each contain an amount of data equal to the storage capacity of a physical memory metablock, thus allowing a one-to-one mapping of the logical groups into the metablocks.

Data stored at specific host logical addresses are frequently overwritten by new data as the original stored data become obsolete. The memory system controller, in response, writes the new data in an erased block and then changes the logical-to-physical address table for those logical addresses to identify the new physical block to which the data at those logical addresses are stored. The blocks containing the original data at those logical addresses are then erased and made available for the storage of new data. Such erasure often must take place before a current data write operation may be completed if there is not enough storage capacity in the pre-erased blocks from the erase block pool at the start of writing. This can adversely impact the system data programming speed. The memory controller typically learns that data at a given logical address has been rendered obsolete by the host only when the host writes new data to their same logical address. Many blocks of the memory can therefore be storing such invalid data for a time.

The sizes of blocks and metablocks are increasing in order to efficiently use the area of the integrated circuit memory chip. This results in a large proportion of individual data writes storing an amount of data that is less than the storage capacity of a metablock, and in many cases even less than that of a block. Since the memory system controller normally directs new data to an erased pool metablock, this can result in portions of metablocks going unfilled. If the new data are updates of some data stored in another metablock, remaining valid metapages of data from that other metablock having logical addresses contiguous with those of the new data metapages are also desirably copied in logical address order into the new metablock. The old metablock may retain other valid data metapages. This results over time in data of certain metapages of an individual metablock being rendered obsolete and invalid, and replaced by new data with the same logical address being written to a different metablock.

In order to maintain enough physical memory space to store data over the entire logical address space 161, such data are periodically compacted or consolidated (garbage collection). It is also desirable to maintain sectors of data within the metablocks in the same order as their logical addresses as much as practical, since this makes reading data in contiguous logical addresses more efficient. So data compaction and garbage collection are typically performed with this additional goal. Some aspects of managing a memory when receiving partial block data updates and the use of metablocks are described in U.S. Pat. No. 6,763,424.

Data compaction typically involves reading all valid data metapages from a metablock and writing them to a new metablock, ignoring metapages with invalid data in the process. The metapages with valid data are also preferably arranged with a physical address order that matches the logical address order of the data stored in them. The number of metapages occupied in the new metablock will be less than those occupied in the old metablock since the metapages containing invalid data are not copied to the new metablock. The old block is then erased and made available to store new data. The additional metapages of capacity gained by the consolidation can then be used to store other data.

During garbage collection, metapages of valid data with contiguous or near contiguous logical addresses are gathered from two or more metablocks and re-written into another metablock, usually one in the erased block pool. When all valid data metapages are copied from the original two or more metablocks, they may be erased for future use.

Data consolidation and garbage collection take time and can affect the performance of the memory system, particularly if data consolidation or garbage collection needs to take place before a command from the host can be executed. Such operations are normally scheduled by the memory system controller to take place in the background as much as possible but the need to perform these operations can cause the controller to have to give the host a busy status signal until such an operation is completed. An example of where execution of a host command can be delayed is where there are not enough pre-erased metablocks in the erased block pool to store all the data that the host wants to write into the memory and data consolidation or garbage collection is needed first to clear one or more metablocks of valid data, which can then be erased. Attention has therefore been directed to managing control of the memory in order to minimize such disruptions. Many such techniques are described in the following U.S. patent applications: Ser. No. 10/749,831, filed Dec. 30, 2003, entitled "Management of Non-Volatile Memory Systems Having Large Erase Blocks," now publication no. 2005/0144358 A1; Ser. No. 10/750,155, filed Dec. 30, 2003, entitled "Non-Volatile Memory and Method with Block Management System,"; Ser. No. 10/917,888, filed Aug. 13, 2004, entitled "Non-Volatile Memory and Method with Memory Planes Alignment," now publication no. 2005/0141313 A1; Ser. No. 10/917,867, filed Aug. 13, 2004, now publication no. 2005/0141312 A1; Ser. No. 10/917,889, filed Aug. 13, 2004, entitled "Non-Volatile Memory and Method with Phased Program Failure Handling," now publication no. 2005/0166087 A1; Ser. No. 10/917,725, filed Aug. 13, 2004, entitled "Non-Volatile Memory and Method with Control Data Management," now publication no. 2005/0144365 A1; Ser. No. 11/192,220, filed Jul. 27, 2005, entitled "Non-Volatile Memory and Method with Multi-Stream Update Tracking";

Ser. No. 11/192,386, filed Jul. 27, 2005, entitled "Non-Volatile Memory and Method with Improved Indexing for Scratch Pad and Update Blocks"; and Ser. No. 11/191,686, filed Jul. 27, 2005, entitled "Non-Volatile Memory and Method with Multi-Stream Updating".

One challenge to efficiently control operation of memory arrays with very large erase blocks is to match and align the number of data sectors being stored during a given write operation with the capacity and boundaries of blocks of memory. One approach is to configure a metablock used to store new data from the host with less than a maximum number of blocks, as necessary to store a quantity of data less than an amount that fills an entire metablock. The use of adaptive metablocks is described in U.S. patent application Ser. No. 10/749,189, filed Dec. 30, 2003, entitled "Adaptive Metablocks," now publication no. 2005/0144357 A1. The fitting of boundaries between blocks of data and physical boundaries between metablocks is described in patent application Ser. No. 10/841,118, filed May 7, 2004, now publication no. 2005/0144363 A1, and Ser. No. 11/016,271, filed Dec. 16, 2004, now publication no. 2005/0144367 A1, entitled "Data Run Programming."

The memory controller may also use data from the FAT table, which is stored by the host in the non-volatile memory, to more efficiently operate the memory system. One such use is to learn when data has been identified by the host to be obsolete by deallocating their logical addresses. Knowing this allows the memory controller to schedule erasure of the blocks containing such invalid data before it would normally learn of it by the host writing new data to those logical addresses. This is described in U.S. patent application Ser. No. 10/897,049, filed Jul. 21, 2004, entitled "Method and Apparatus for Maintaining Data on Non-Volatile Memory Systems," now publication no. 2006/0020744 A1. Other techniques include monitoring host patterns of writing new data to the memory in order to deduce whether a given write operation is a single file, or, if multiple files, where the boundaries between the files lie. U.S. patent application Ser. No. 11/022,369, filed Dec. 23, 2004, entitled "FAT Analysis for Optimized Sequential Cluster Management," now publication no. 2006/0020745 A1, describes the use of techniques of this type.

To operate the memory system efficiently, it is desirable for the controller to know as much about the logical addresses assigned by the host to data of its individual files as it can. Data files can then be stored by the controller within a single metablock or group of metablocks, rather than being scattered among a larger number of metablocks when file boundaries are not known. The result is that the number and complexity of data consolidation and garbage collection operations are reduced. The performance of the memory system improves as a result. But it is difficult for the memory controller to know much about the host data file structure when the host/memory interface includes the logical address space 161 (FIG. 7), as described above.

Figures 8, 10:
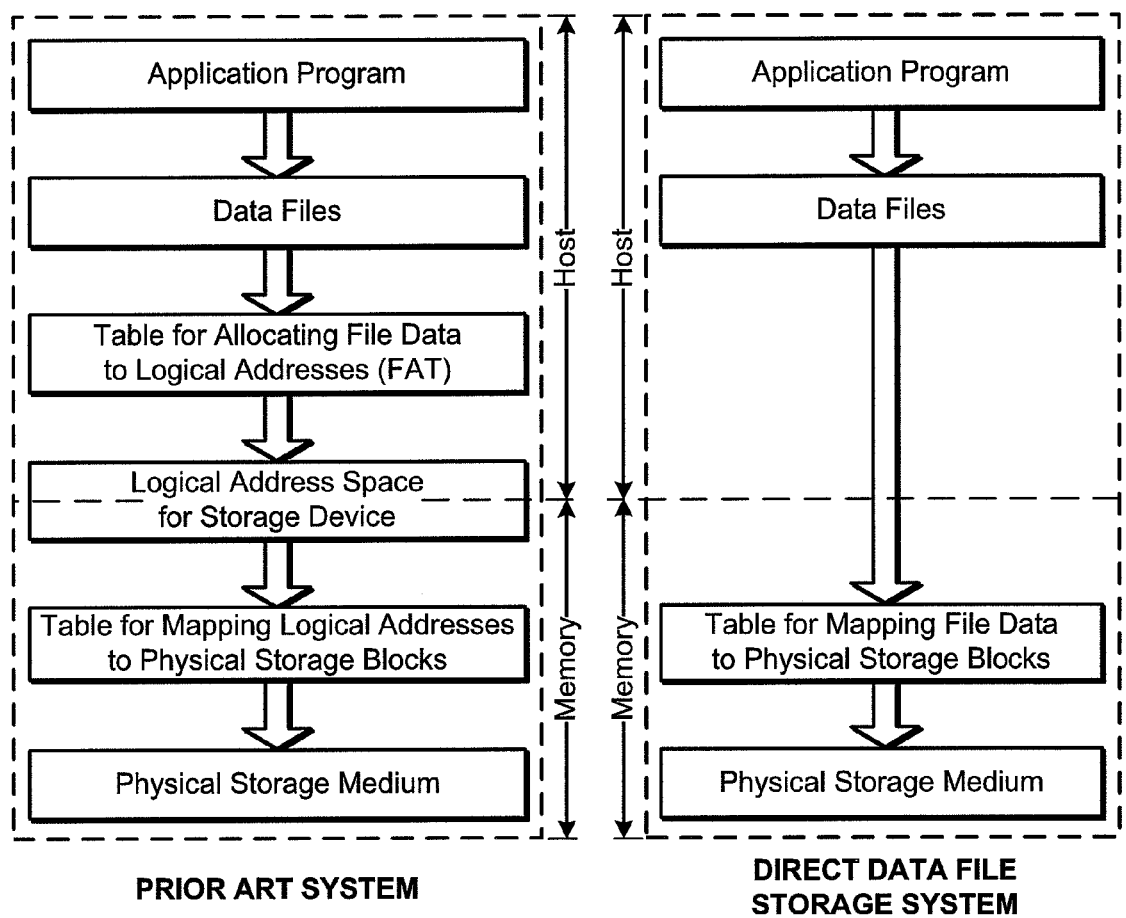
FIG. 8 illustrates in a different manner than FIG. 7 a common prior art logical address interface between a host and a re-programmable memory system.
FIG. 10 illustrates in a different manner than FIG. 9 a direct file storage interface between a host and a re-programmable memory system, according to the present invention.

Referring to FIG. 8, the typical logical address host/memory interface as already shown in FIG. 7 is illustrated differently. The host generated data files are allocated logical addresses by the host. The memory system then sees these logical addresses and maps them into physical addresses of blocks of memory cells where the data are actually stored.

File-Based Memory Interface and Operation

A different type of interface between a host and memory system for the storage of mass amounts of data eliminates use of the logical address space. The host instead logically addresses each file by a unique fileID (or other unique reference) and offset addresses of units of data (such as bytes) within the file. This file address is given directly to the memory system controller, which then keeps its own table of where the data of each host file are physically stored. This new interface can be implemented with the same memory system as described above with respect to FIGS. 2-6. The primary difference with what is described above is the manner in which that memory system communicates with a host system.

Figure 9:
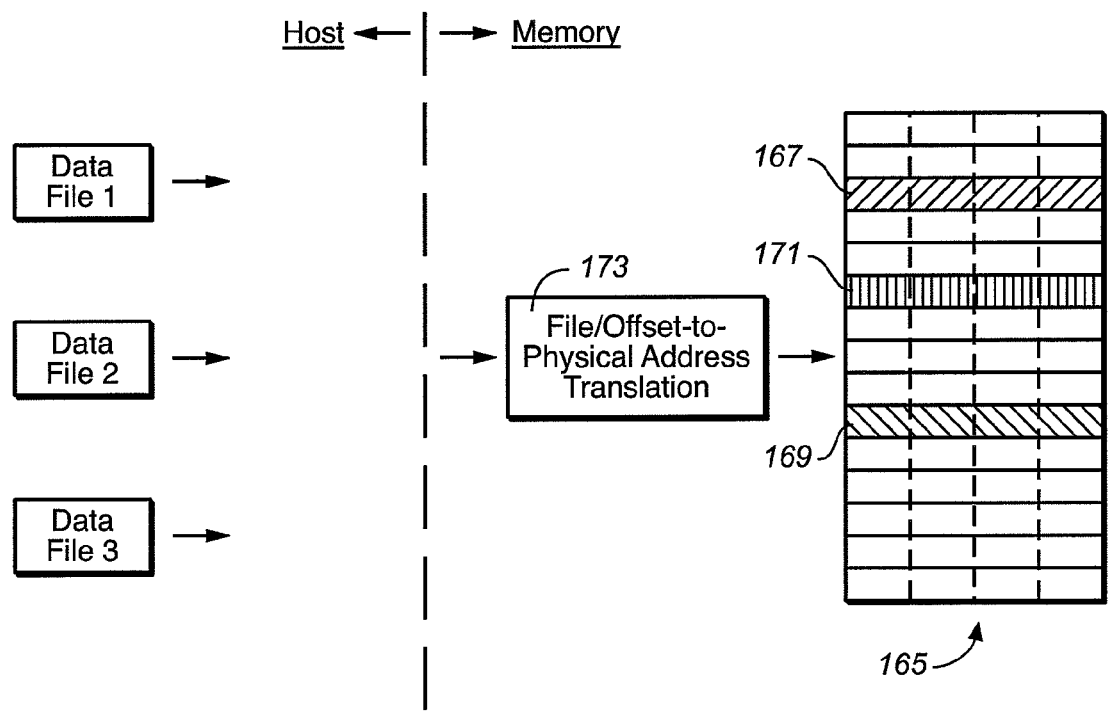
FIG. 9 illustrates a direct file storage interface between a host and a re-programmable memory system, according to the present invention.

This file-based interface is illustrated in FIG. 9, which should be compared with the logical address interface of FIG. 7. An identification of each of the Files 1, 2 and 3 and offsets of data within the files of FIG. 9 are passed directly to the memory controller. This logical address information is then translated by a memory controller function 173 into physical addresses of metablocks and metapages of the memory 165. A file directory keeps track of the host file to which each stored sector, page or other unit of file data belongs.

The file-based interface is also illustrated by FIG. 10, which should be compared with the logical address interface of FIG. 8. The logical address space and host maintained FAT table of FIG. 8 are not present in FIG. 10. Rather, data files generated by the host are identified to the memory system by file number and offsets of data within the file. The memory system controller then directly maps the files to the physical blocks of the memory cell array and maintains file directory and index table information of memory blocks into which host files are stored. It is then unnecessary for the host to maintain the file allocation table (FAT) that is currently necessary for managing a logical address interface.

Figure 11:
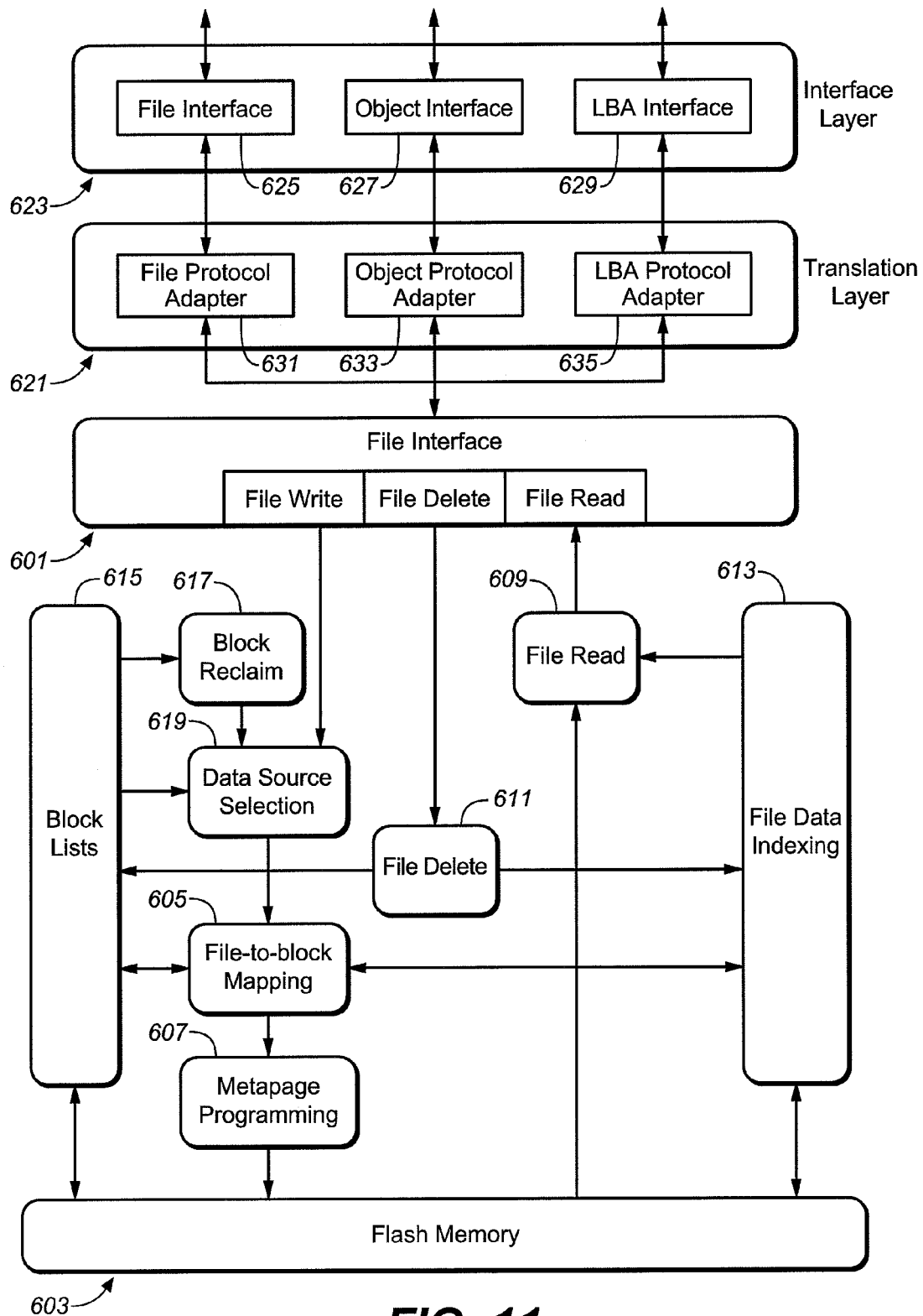
FIG. 11 is a functional block diagram of a memory system operating with a direct data file storage interface.

FIG. 11 is a general block diagram of the major functions of a direct data file system that are carried out by the memory system firmware executed by its processor and by other circuits of the controller. It provides an overall framework in which the specific memory operations described hereinafter may be considered. A file-based interface 601 layer passes commands and data between the memory system and an external host system or a host application being executed on the same memory card or flash drive, for the three main functions of the memory system, namely writing files, deleting files and reading files. Data are stored in a flash memory array 603.

A file block management function 605 organizes storage of data in flash memory according to the files by which the data is identified, and minimizes the incidence of blocks storing data for more than one file. The physical block of memory cells of the memory 603 is the basic unit of data management.

Data are organized into metapages by a function 607 for writing into the memory 603, such that individual metapages contain data for a contiguous logical offset address range within a specific file. A function 609 controls access to the memory 603 for reading data stored therein. The deletion of data of a file, when commanded by the host, causes a function 611 to update file indexing information maintained by a function 613 and lists of blocks in a function 615.

The file data indexing 613 indexes the individual files stored in the memory 603 by a unique file identifier and offset addresses of data within the file. The data for each file are stored as a set of data groups having contiguous logical offset addresses. A file directory identifies the locations in a file index table (FIT) of sets of data group entries for the individual files. The identity of blocks that are erased, either partially programmed with file data or that contain file data together with obsolete data are maintained by the block list function 615.

The primary purpose of the garbage collection and data consolidation functions described above are to reclaim unused memory space for use to store additional data. In garbage collection, valid data of a source block are copied from blocks also containing obsolete data into one or more destination blocks that have at least some erased space. This gathers valid data into a fewer number of blocks, thus freeing up capacity occupied by obsolete data once the original source block(s) are erased. In data consolidation, valid data of one partially filled block, which thus also contains erased but unused space, are combined with valid data of another partially filled block. Partially filled blocks result most commonly from writing a new file that is closed with its last erased block only partially filled. Once data are consolidated, the source blocks containing the data just copied, which are then duplicate data, are then erased and made available for the storage of new data.

Both of the garbage collection and data consolidation operations are handled herein together as block reclamation. A function 617 reclaims blocks by controlling the copying of valid file data from a physical block having unprogrammed metapages, or containing obsolete data, to other blocks. This allows the original block to be erased to reclaim the unused space it contained and make this space available for the storage of new file data. A function 619 adaptively controls the occurrence and duration of block reclaim operations, according to the amount of reclaimable capacity and number of erased blocks. Block reclaim is performed at an optimum rate relative to the rate of writing new file data in a manner that maintains good overall performance of the memory system.

In the functional diagram of FIG. 11, a translation layer 621 and interface layer 623 are above the file interface 601, which interfaces with the backend system of the flash memory and controls its operation. In this example, the interface layer 623 has the capability of communicating data outside of the memory system with a host or otherwise, according one of three different protocols. A file interface 625 is that being primarily described herein, wherein data of individual files are identified by a unique file identifier and logical offset addresses within the file. An object interface 627 has a primary use to transfer data files between electronic devices, where the sizes of the files are usually known. Existing protocols for the interface 627 include the Media Transfer Protocol (MTP) and the Picture Transfer Protocol (PTP) from Microsoft Corporation. A backward compatible logical (LBA) interface 629 is also included in this example. Data are transferred through the interface 629 with the protocol currently used by flash memory cards, similar to that of magnetic disk drive systems, where the host addresses data to a defined logical address space of the memory system.

The translation layer 621 includes protocol adaptors 631, 633 and 635 that function to convert the protocols of respective interface protocols 625, 627 and 629 into a common protocol for the file interface 601. Commands, data formats and the like are converted between different protocols by the translation layer. The LBA protocol adaptor 635 additionally divides the logical address space of the memory system into static files. These files are then handled by the file interface 601 in the same manner as distinct files communicated through the interfaces 625 and 627. Details of the function of the LBA protocol adaptor 635 may be had by reference to U.S. patent application Ser. No. 11/196,869, filed Aug. 3, 2005, naming S. A. Gorobets as inventor. More information of the translation and interface layers 621 and 623 is given in U.S. patent application Ser. No. 11/316,577, filed Dec. 21, 2005, naming Alan Sinclair as inventor.

When a new data file is programmed into the memory, the data are written into an erased block of memory cells beginning with the first physical location in the block and proceeding through the locations of the block sequentially in order. The data are programmed in the order received from the host, regardless of the order of the offsets of that data within the file. Programming continues until all data of the file have been written into the memory. If the amount of data in the file exceeds the capacity of a single memory block, then, when the first block is full, programming continues in a second erased block. The second memory block is programmed in the same manner as the first, in order from the first location until either all the data of the file are stored or the second block is full. A third or additional blocks may be programmed with any remaining data of the file. Multiple blocks or metablocks storing data of a single file need not be physically or logically contiguous. For ease of explanation, unless otherwise specified, it is intended that the term "block" as used herein refer to either the block unit of erase or a multiple block "metablock," depending upon whether metablocks are being used in a specific system.

Figure 12:
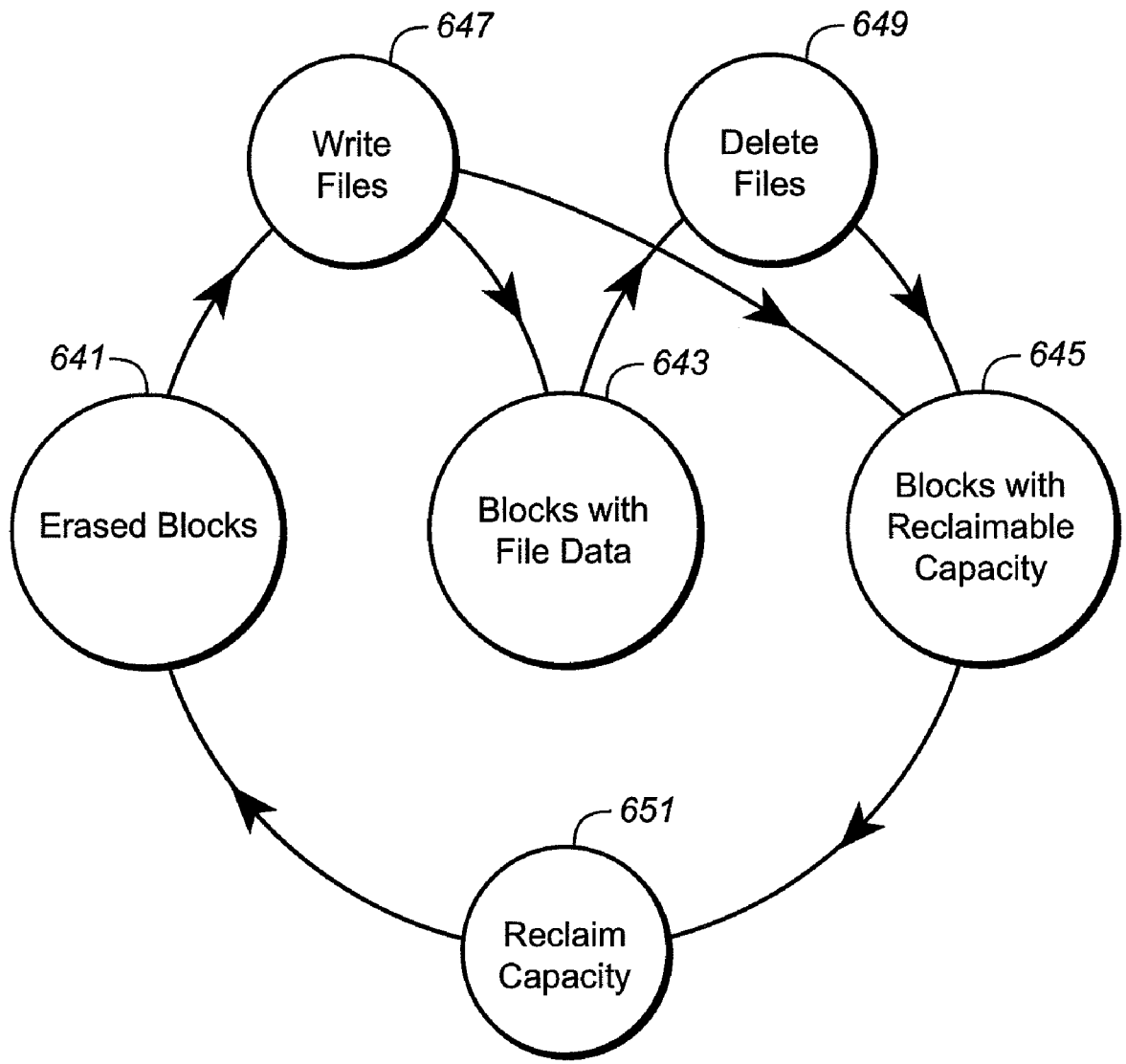
FIG. 12 illustrates an operating cycle of a direct data file memory.

The state diagram of FIG. 12 illustrates overall functioning of the memory operations shown in FIG. 11. Individual memory blocks may be viewed to be in one of three states. These are erased blocks 641, blocks 643 that are storing valid file data without reclaimable capacity and blocks 645 that may contain some valid file data but which also have reclaimable capacity from unprogrammed erased pages and/or obsolete (invalid) data stored in them. Data are written to erased memory blocks by a function 647, thereby to result in blocks in category 643 or 645, depending upon whether the resulting programmed blocks retain any reclaimable capacity. When files are deleted, as indicated by a function 649, blocks 643 containing data of the file are converted to blocks 645 with reclaimable capacity. Unused storage capacity of the blocks 645 is reclaimed by a function 651 that results in returning those blocks to the status of erased blocks 641 to which new data may be written.

Referring to FIG. 13A, the writing of a data file to the memory system is illustrated. A data file 181, in this example, is larger than the storage capacity of one block or metablock 183 of the memory system, which is shown to extend between solid vertical lines. A portion 184 of the data file 181 is therefore also written into a second block 185. These memory cell blocks are shown to be physically contiguous but they need not be. Data from the file 181 are written as they are received streaming from the host until all the data of the file have been written into the memory. In the example of FIG. 13A, the data 181 are the initial data for file.

A preferred way for the memory system to manage and keep track of the stored data is with the use of variable sized data groups. That is, data of a file are stored as a plurality of groups of data that may be chained together in a defined order to form the complete file. Preferably, however, the order of the data groups within the file is maintained by the memory system controller through use of the file index table (FIT). As a stream of data from the host are being written, a new data group is begun whenever there is a discontinuity either in the logical offset addresses of the file data or in the physical space in which the data are being stored. An example of such a physical discontinuity is when data of a file fills one block and begins to be written into another block. This is illustrated in FIG. 13A, wherein a first data group fills the first block 183 the remaining portion 184 of the file is stored in the second block 185 as a second data group. The first data group can be represented by (F0,D0), where F0 is the logical offset of the beginning of the data file and D0 is the physical location within memory where the file begins. The second data group is represented as (F1,D1), where F1 is the logical file offset of data that is stored at the beginning of the second block 185 and D1 is the physical location where that data are stored.

The amount of data being transferred through the host-memory interface may be expressed in terms of a number of bytes of data, a number of sectors of data, or with some other granularity. A host most often defines data of its files with byte granularity but then groups bytes into sectors of 512 bytes each, or into clusters of multiple sectors each, when communicating with a large capacity memory system through a current logical address interface. This is usually done to simplify operation of the memory system. Although the file-based host-memory interface being described herein may use some other unit of data, the original host file byte granularity is generally preferred. That is, data offsets, lengths, and the like, are preferably expressed in terms of byte(s), the smallest reasonable unit of data, rather than by sector(s), cluster(s) or the like. This allows more efficient use of the capacity of the flash memory storage with the techniques described herein.

The new file written into the memory in the manner illustrated in FIG. 13A is then represented in a FIT as a sequence of index entries (F0,D0), (F1,D1) for the data groups, in that order. That is, whenever the host system wants to access a particular file, the host sends its fileID or other identification to the memory system, which then accesses its FIT to identify the data groups that make up that file. The length <length> of the individual data groups may also be included in their individual entries, for convenience of operation of the memory system. When used, the memory controller calculates and stores the lengths of the data groups.

So long as the host maintains the file of FIG. 13A in an opened state, a physical write pointer P is also preferably maintained to define the location for writing any further data received from the host for that file. Any new data for the file are written at the end of the file in the physical memory regardless of the logical position of the new data within the file. The memory system allows multiple files to remain open at one time, such as 4 or 5 such files, and maintains a write pointer P for each of them. The write pointers for different files point to locations in different memory blocks. If the host system wants to open a new file when the memory system limit of a number of open files already exists, one of the opened files is first closed and the new file is then opened.

FIG. 13B illustrates the appending of data by the host to the end of the previously written but still open file of FIG. 13A. Data 187 are shown to be added by the host system to the end of the file, which are also written in the second block 185 at the end of the data for that file. The appended data becomes part of the data group (F1,D1), which therefore now contains more data, since there is neither a logical nor a physical address discontinuity between the existing data group 184 and the appended data 189. The full file is thus still represented as a sequence of index entries (F0,D0), (F1,D1) in the FIT. The address of the pointer P is also changed to that of the end of the stored appended data.

An example of the insertion of a block of data 191 into the previously written file of FIG. 13A is shown in FIG. 13C. Although the host is inserting the data 191 into the file, the memory system appends the inserted data at a location 193 at the end of the file data previously written. It is not necessary to rewrite the data of the file in their logical order when data are being inserted into an open file, although this may be done later in the background after the host closes the file. Since the inserted data is stored entirely within the second memory block 185, if forms a single new group (F1,D3). But the making of this insert results in the previous data group (F0,D0) of FIG. 13A being divided into two groups, one (F0,D0) before the insert and one (F2,D1) after the insert. This is because a new data group needs to be formed whenever there is a logical discontinuity of the data, such as occurs at the beginning F1 of the insert and at the end F2 of the insert. The group (F3,D2) is the result of physical address D2 being the beginning of the second block 185. The groups (F1,D3) and (F3,D2) are maintained separate, even though they are stored in the same memory block, because there is a discontinuity in the offsets of the data stored in them. The original file with the insert is then represented in the memory system FIT by data group index entries (F0,D0), (F1,D3), (F2,D1), (F3,D2), in that order. It should be noted from the examples of FIGS. 13A, 13B and 13C, that new data for a new or existing file may be written without making obsolete any data in the memory.

As an alternative to the insertion of data into an existing file that is illustrated in FIG. 13C, the file may be rewritten into the memory as a separate file by the host whenever data have been inserted. This separate file may then be treated by the memory system as a new file. The old file is then deleted by the host, and the memory system may respond by reclaiming the space in which the old file is stored, the data of which are now obsolete.

FIG. 13D illustrates another example, wherein a certain portion of the data originally written in the manner shown in FIG. 13A is updated. A portion 195 of the data file is shown to be updated. Rather than rewriting the entire file in the memory system with the update, an updated portion 197 of the file is appended to the data previously written. A portion 199 of the data previously written is now obsolete. After updating, the file is represented in the memory system FIT by data groups index entries (F0,D0), (F1,D3), (F2,D1), (F3,D2), in that order. The single data group (F0,D0) of FIG. 13A is again divided into pieces in FIG. 13D, one before the updated portion, the updated portion and one after the updated portion. It is desirable to reclaim the space 199 occupied by obsolete data but this is preferably done later, not as part of writing the file data in the memory. Such reclamation will typically result in a fewer number of data groups of data for a particular file being stored.

The offsets of the data of each file are preferably maintained continuous in the correct logical order after the file's creation or modification according to the preceding description. Therefore, as part of an operation to insert data into a file, for example, offsets of the inserted data provided by the host are continuous from the offset immediately preceding the insert and data already in the file after the insert are incremented by an amount of the inserted data. Updating an existing file most commonly results in data within a given address range of an existing file being replaced by a like amount of updated data, so the offsets of other data of the file usually need not be replaced.

It will be noted that all of the data allocation and indexing functions described above with respect to FIG. 13 are performed by the controller of the memory system. Along with an appropriate command, the host merely communicates the fileID and offsets of data within the file that are being sent to the memory system. The memory system does the rest.

An advantage of directly writing file data from the host into the flash memory in the manner just described is that the granularity or resolution of the data so stored may be maintained the same as that of the host. If a host application writes file data with a one-byte granularity, for example, that data may be also be written into the flash memory with a one-byte granularity. The amount and location of data within an individual data group is then measured in a number of bytes. That is, the same offset unit of data that is separately addressable within the host application file is also separately addressable within that file when stored in the flash memory. Any boundaries between data groups of the same file within a block are then specified in the index table to the nearest byte or other host offset unit. Similarly, boundaries between data groups of different files within a block are defined in the unit of the host offset.

The term "sector" is used herein with large block memories to denote the unit of stored data with which an ECC is associated. The sector is also the minimum unit of data transfer to and from flash memory. A "page" is used to denote a unit of memory cells within a block and is the minimum unit of programming. The term "metapage" is used to denote a page with the full parallelism of a metablock. The metapage is the maximum unit of programming.

File Block Management

An example of the file-to-block mapping function 605 of FIG. 11 will now be described. When data are written in the memory system, either from an external host or from internal host processing, or copied from some other location in the memory as part of a data reclaim operation, a destination block for storing the data is chosen according to a specific process. In this process, certain types of blocks are recognized on the basis of the structure of file data stored in them. Each file stored in the memory system is then noted to be in one of a number of states, each file state being defined by the number and types of blocks in which data of the file are stored. When data are to be written for a file, its current state and permitted transitions from one state to another are controlled to restrict the number of blocks containing data for a specific file that also contain data of one or more other files. This promotes the efficient utilization of the memory blocks and reduces the frequency of later reclaim operations necessary to maintain enough erased blocks in a full memory for accepting new or copied data.

The types of blocks recognized in this example that contain file data are as follows:

A "file block" has been fully programmed, and contains valid data of a single file. It may also contain some obsolete data.

A "program block" has been partially programmed, and contains valid data of only a single file. Some erased capacity remains in the block. It may also contain some obsolete data.

A "common block" has been partially programmed, and contains valid data of two or more files. Some erased capacity remains. It may also contain some obsolete data.

A "full common block" has been fully programmed and contains valid data of two or more files. It may also contain some obsolete data.

A "full program block" is a transient designation for a program block that has become full, when it contains the most recently written data for the file and also has some obsolete data, and the range of offset addresses that exist for the file can be accommodated by a single block. If the next data to be written for the file are beyond the range of offset addresses that can be accommodated by a single block, a full program block then becomes designated as a file block. The full program block is equivalent to a full chaotic block of an existing logical block address (LBA) system, since certain logical offsets of the file are written multiple times in the block, once designating valid data and at least one other time to designate obsolete data.

Another type of block is the "erased block", where the total capacity of the block is unprogrammed and available to accept data. When the memory is full or nearly full of data, a pool of a specified minimum number of erased blocks is typically maintained by continuously reclaiming unused capacity that exists within blocks that are being used.

A "fractal block" is a collective term that refers to a program block, common block or a full common block. A fractal block for a file contains valid data of the file, together with either unprogrammed memory capacity, valid data for other files, or both. A primary purpose of the techniques described herein is to minimize the number of fractal blocks in a memory system by managing the type of active block that is designated to receive data of a file. This reduces the instances of garbage collection and data consolidation (block reclaim operations) necessary to maintain the specified minimum number of erased blocks. The rate at which data may be written into the memory is then increased since less time is taken for internal copying of data to reclaim fragments of unused capacity in previously programmed blocks.

Additional terms are also used herein to collectively describe other types of blocks:

A "partial block" contains some unprogrammed capacity, valid data of one or more files and may contain some obsolete data. The program block and common block are examples of partial blocks.

An "obsolete block" is a file block or a full common block that contains some obsolete data. The obsolete block does not contain any erased capacity, and contains both valid and obsolete data.

An "invalid block" contains no valid data. The invalid block contains at least some obsolete data and may contain erased capacity but does not contain any valid data.

Figure 14A:
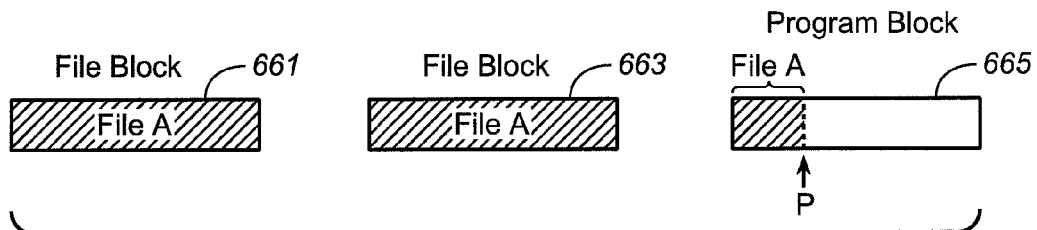
FIGS. 14A-14E show examples of a data file stored in various allowed combinations of types of blocks.

FIGS. 14A-14E illustrate some examples of the uses of the types of blocks listed above. In FIG. 14A, data of a file A have filled blocks 661 and 663, and partially filled a third block 665. Data are written from left-to-right in each block of this example, first filling the block 661, then the block 663 and thereafter being written into a portion of the block 665. The remaining portion of the block 665 is unprogrammed erased capacity that can store additional data. The blocks 661 and 663 are file blocks, by the above-listed definitions, and the block 665 is a program block. Any new data will be written into the block 665, beginning at the program pointer P. The pointer P moves from left-to-right as data are written to the block to always point to the next available storage location in the block. Such a pointer is maintained for individual blocks that retain unprogrammed erased capacity, whether currently active or not, so that the physical address of any other data to be written to the block is always known.

Figure 14B:
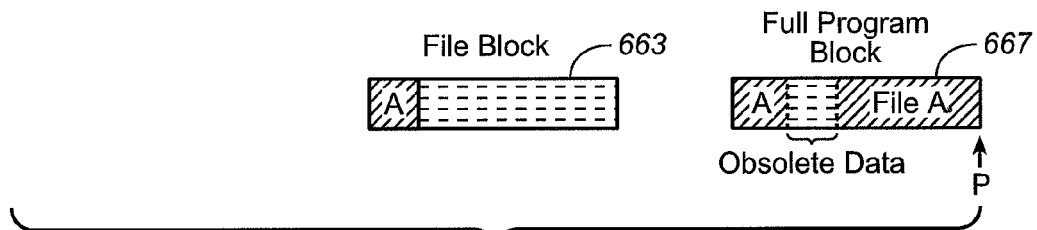

The example of FIG. 14B shows file A being stored in a file block 662 and a full program block 667. By the definition given above for a full program block, the block 667 contains the most recently written data of file A, some obsolete data and no unused capacity. Also by that definition, the total amount of data of file A stored in the two blocks 662 and 667 is equal to the storage capacity of one block. The last data for file A was written at the end of the block 667 where the program pointer P is shown. Any further data of file A that are received will be programmed into another block. That block can be another block into which the data of file A in block 667 are collected since the space occupied by obsolete data will be reclaimed. Alternatively, additional data can be written into a fully erased block. In either case, the pointer P moves to the new block at the beginning location for additional data of file A. The block 667 then becomes a file block. The block 667 is thus transitory since it exists only for the time that it is exactly as shown in FIG. 14B. Just before it is totally filed with data of file A, it is a program block and immediately upon any new data for file A being written, it becomes a file block.

Figure 14C:
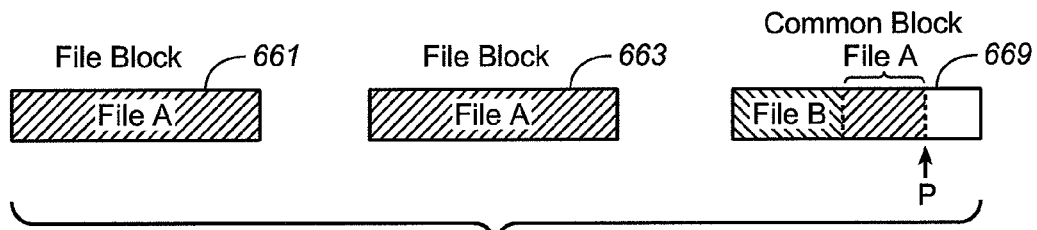

The example of FIG. 14C includes a block 669 that is a common block since it contains data of another file B as well as data of the current file A, plus some unprogrammed capacity. New data are written into the block 669 at the end of the file A, beginning where the program pointer P is shown. Block 669 is the active block for file A. It may also be the active block for file B, in which case additional data of either of files A or B may be written at the program pointer P. Alternatively, a separate block (not shown) may be the active block for file B.

Data of a file may be written directly into erased capacity of a partial block that already contains data of another file, rather than into an erased block, in order to make good use of unprogrammed capacity in this form. This is particularly useful when a known quantity of file data less than the capacity of a full block is to be written. Existing partial blocks are searched to find an amount of erased capacity that fits the known amount of data to be written. The number of pages (or metapages if the metablocks are being used) of data is compared with the number of pages of unprogrammed, erased capacity in partial blocks. When unused erased space of a program block is programmed in this way, it is converted into a common block.

Figure 14D:
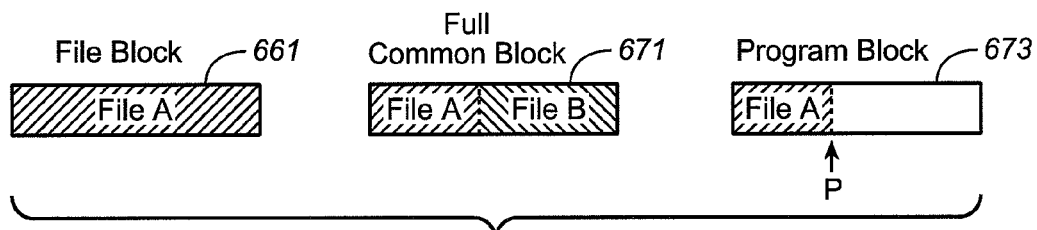

In FIG. 14D, file A is stored in the file block 661, a portion of a block 671 and a portion of a block 673. The block 671 is a full common block since it is full of data of two files A and B. The block 673 is a program block, similar to the block 665 of FIG. 14A. The block 673 is the active block for the file and a pointer P points to the location of the unused capacity within the block 673 where additional data will first be written.

Figure 14E:
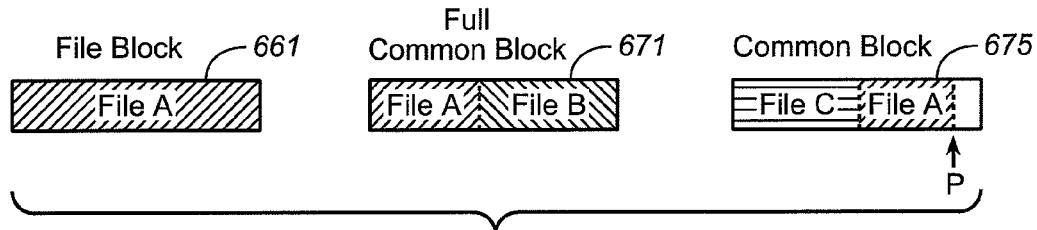

The file A is written in the example of FIG. 14E into a portion of the full common block 671 and a common block 675. The block 675 contains data of a third file C. The pointer P points to the first location in the unused portion of the active block 675 where additional data will be written.

Although the examples of FIGS. 14A-14E show data of file A stored in multiple blocks in order to illustrate the several different types of blocks, a file in many cases may be small enough to be stored in a lesser number of blocks, even a single block. The techniques described herein are also applicable to such small files. Also, a larger file can occupy pages in more than three blocks.

It will be noted that blocks 665, 667, 669, 671, 673 and 675 are fractal blocks. It is desired to minimize the number of fractal blocks occupied by data of any one file since their presence increases the likelihood of the need to reclaim unused capacity in them and thus adversely affect system performance. Unused erased capacity exists in partial blocks 665, 669, 673 and 675 but it may not be efficient to write new data from a host directly into this space unless the quantity of unwritten data for a file is known and that known amount matches the unused capacity of one of these blocks. It is most common that the amount of data from the host for a particular file is not known, so these bits of capacity are not readily filled. Data may therefore need to be moved from another block into the unused space during a reclaim operation in order to make efficient use of the memory capacity. Blocks 669, 671 and 675 contain data of more than one file, which means that when one of the files is deleted or its data stored in the common block becomes obsolete, data reclaim will likely be done to reclaim the capacity of the block occupied by obsolete data.

Therefore, in order to reduce the number of time consuming data reclaim operations, data of a particular file are allowed to be stored in only one, two or some other number of fractal blocks at any one time. In the specific example described herein, data of any one file may be stored in two or fewer fractal blocks but no more. A process of designating a new active block to store data of a file is so constrained. One of a set of permitted file states is assigned to each file that is defined by the types of blocks in which data of the file are stored. When a new active block needs to be assigned for receiving data of a particular file, such as when an existing block becomes full, the type of block so designated depends upon the state of the file and, in many cases, also other factors.

Figures 15, 18:
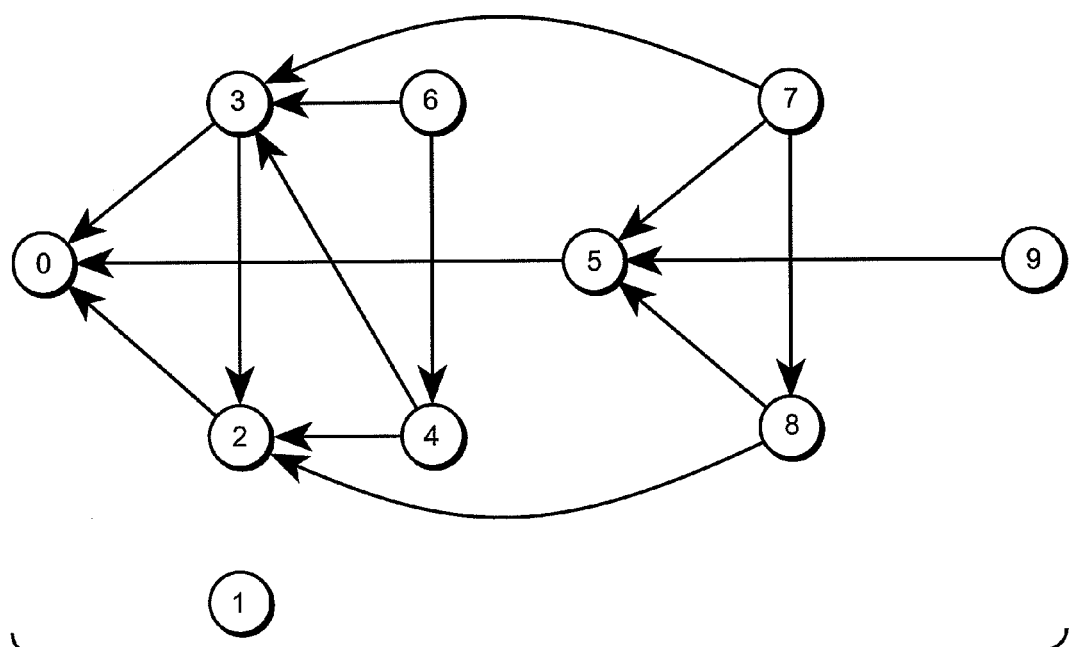
FIG. 15 is a list of permitted file states by the types of blocks in which data of individual files are stored.
FIG. 18 is a state diagram showing resulting secondary transitions between the file states listed in FIG. 15.

Definitions of ten permitted file states 0-9 are given in the table of FIG. 15, in terms of types and combinations of fractal blocks and a full program block in which data of the file are stored, in a specific implementation of the memory operation concepts described herein. Each of the permitted file states allows storage of data in no more than two fractal blocks or only one full program block. There is no restriction on the number of file blocks that may be associated with a file. These file states are used to select an active block for the storage of file data, both when that data are received by the memory from a host and when the data are being relocated within the memory during a reclaim operation. The state of every file stored in the memory system is monitored and recorded in the file index table (FIT) 613 (FIG. 11), such as in a header for the FIT records of the file, together with other information. Whenever a state transition occurs, the FIT entry is updated to record the new file state.

Figure 16:
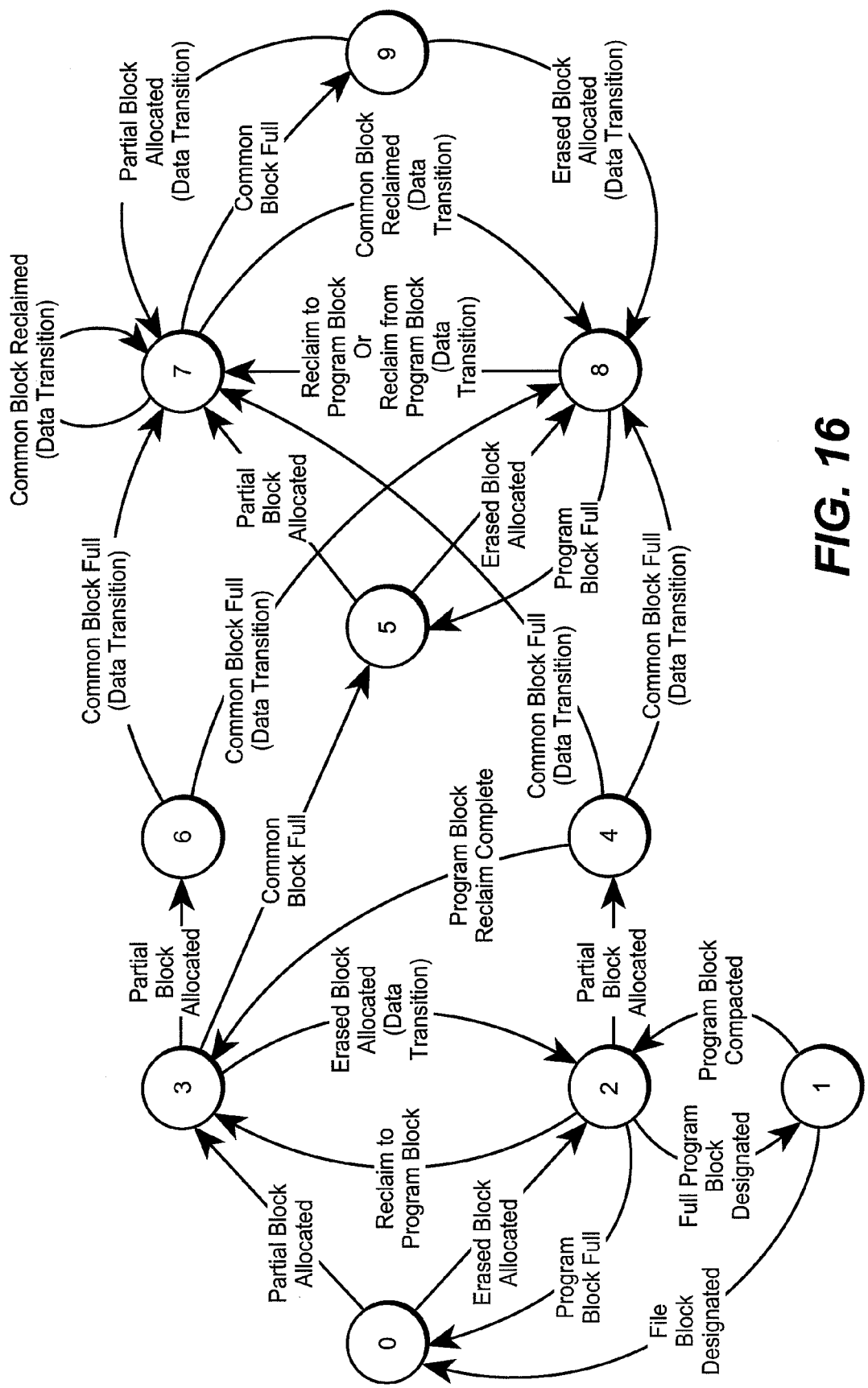
FIG. 16 is a state diagram showing permitted primary transitions between the file states listed in FIG. 15.
Figure 17D:
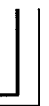
FIG. 17 is a table that describes the primary file state transitions illustrated in the state diagram of FIG. 16.

Resulting primary transitions among the file states 0-9 defined in FIG. 15 are illustrated by a state diagram of FIG. 16 and described in the table of FIG. 17. These three figures provide the details of a preferred operation of the memory system, and are believed to be sufficient by themselves to do this. Certain aspects of this operation, however, will now be additionally described.

As shown in the table of FIG. 15, a file is designated to be in state 0 because no data are stored in a fractal block. The only other type of block is a file block, so either the file has data written only to one or more file blocks, which most likely is a temporary condition because of the exactness required between the amount of data and block capacity, or the file has no data stored in any block. This later condition occurs when the memory system first receives information of a new file but has not yet written any data for that file. In either case, an active block needs to be designated to receive the data. When data of an unknown length are being provided from the host, an erased block is designated as the active block. Once data are written into the erased block, the file transitions from state 0 to state 2 (see FIG. 16) since this block has become an active program block.

But when in file state 0 and data of the new file received from a host has a known length that is less than the storage capacity of a block, a partial block is designated as the active block if one is available with enough erased capacity for storage of the known amount of data. The file has then transitioned from state 0 to state 3 (see FIG. 16). Such a partial block can be a program block or a common block. The best fit possible is made between the known data length and the remaining storage capacities of available partial blocks. If there is no partial block with sufficient capacity for the known amount of data, then the data are written to an erased block, resulting in the file transitioning from state 0 to state 2 instead.

A characteristic of a file in state 2 is that a program block is allocated to receive additional data of the file. But if the file is large enough, the block will eventually become full and another active block then needs to be designated. If the full block, now a file block, contains no obsolete data, the file returns to state 0, where no active block is designated. An erased block or a partial block is then designated as the new active block, depending upon the amount of additional data to be stored, as discussed above. But if the full block contains obsolete data and the maximum offset for the file is less than the range of offset addresses that can be accommodated by a single block, then it is a full program block, according to the definition given above. It is then preferred that the block be compacted by copying its valid data to an erased block, and the original block erased. The resulting block then contains this valid data and erased capacity, which is a partial block. This new partial block then becomes the active program block. The state of the file has then transitioned from state 2 to state 1 and then back to state 2 (see FIG. 16). But if data for the file are received, while in state 1, whose offset address is beyond the range of addresses that a single block can accommodate, the full program block becomes a file block. The file has then transitioned to state 0.

As a partial block, the active program block that exists when the file is in state 2 may be selected as a destination block for a known amount of data of another file from a source block during a reclaim operation. The identity of the program block is maintained on a list of partial blocks that includes the available erased capacity in each of the blocks on the list. The amount of data to be copied from a source block is fit into the erased capacity of a partial block on the list. If the program block for the current file is selected as a destination block for data of another file during a reclaim operation, the program block becomes an active common block of the current file, after the data of the other file is copied into its erased capacity. The file has then transitioned from state 2 to state 3 (see FIGS. 15 and 16).

Additionally, while the file is in state 2, there is a possibility that the data written into the program block for the file may be copied into another block that is a partial block storing data of another file, as part of an operation to reclaim the program block. In this situation, the destination block of the reclaim operation becomes an active common block. The file has transitioned from state 2 to state 4. Further data for the file are now written into the common block, which is the active block for the file.

When the active common block of a file in state 2 becomes full, it is designated as a full common block. The file is then contained in the limit of two fractal blocks, the full common block and the program block. Since another fractal block may not be allocated to receive data of the file, data of the file may be copied from the program block into an erased block and this new block is then designated as an active program block for the file. Such copying of file data as part of the file state transition is identified herein as a "data transition", and is so noted in FIGS. 16 and 17. The file has then transitioned from state 4 to state 8.

Any data transition is completed as a single operation before the state transition can be considered to be complete. This means that if the file needs an active block into which data may be written, other operations cannot be performed by the memory until the data copying part of the data transition is complete. This data copying is therefore typically not interleaved with other memory operations over time.

A transition from file state 4 to state 3 occurs when its program block is designated to be a reclaim block. Data of the file in the program block are moved to a common block as part of a reclaim operation, after which the common block becomes the active block for the file. Further, once the active common block of a file in state 4 becomes full, the file is stored in two fractal blocks. Another block cannot be allocated as the active block until one of the fractal blocks is eliminated. Data in the program block are therefore moved (data transition) to erased capacity of a partial block as part of a transition from state 4 to state 7, thereby eliminating the fractal program block. The resulting common block then becomes the active block for the file.

When in state 3, data of the file are being written into an active common block. If data of the file are moved during a reclaim operation from the active common block to erased capacity of a partial block, the destination partial block becomes an active common block to which further data of the file are written. The file has then transitioned from state 3 to state 6. But if a good fit of the amount of data to be moved from the source program block cannot be made with the capacity of a partial block on the partial block list, the file data in the common block are moved from that block to an erased block and that erased block becomes an active program block for the file. The file has then transitioned from state 3 to state 2. In the course of this state transition, allocation of an active block includes making a data transition from the original common block to the new erased block, which then becomes the an active program block for the file.

A further possibility when the file is in state 3 is that the active common block to which data of the file are being written becomes full. The file then has no active block to which further data may be written, and has transitioned to state 5. This state is similar in operation to that of file state 0, in that there is no active block for the file but it is different in that data of the file is contained in a full common block when the file is in state 5. When in state 0, there is no fractal block containing data of the file. Both states 0 and 5 are usually temporary states from which a transition takes place as soon as additional data of the file are to be written.

When in state 5, the possible transitions to other file states are similar to those when the file is in state 0 except that some data of the file are stored in a common block when in state 5 and not when in state 0. An erased block is allocated for additional data of the file if the amount of data is unknown, thus creating an active program block and transitioning the file to state 8. If the amount of data are known, they are written into remaining capacity of a partial block, if a good fit of sizes can be made, thereby causing the partial block to become an active common block, and the file transitions from state 5 to state 7. File state 8 is similar to state 2, except that data of the file are stored in a full common block when in state 8 and no such block exists when in file state 2. File state 7 is similarly related to file state 3.

When in file state 6 and the active common block is filled with data, the file is then stored in a full common block and common block. Since the limit in this embodiment of two fractal blocks has been reached, another block cannot be allocated as a program block or some other fractal block. Therefore, a data transition needs to take place. Data of the file from one of the common blocks are moved either into a partial block (file transition to state 7), which then becomes an active common block for the file, or into an erased block (file transition to state 8) if a suitable fit of the data with the erased capacity of a partial block cannot be made.

When in file state 7, the active common block can become full. The file is then being stored in two full common blocks, transitioning to state 9.

Also while the file is in state 7, the common block may be designated as a reclaim block, so data of the file then needs to be relocated. A data transition then takes place. If data of the file are moved from the common block to an erased block, which thereafter becomes an active program block, a transition to file state 8 has taken place. If data of the file are instead moved into a partial block, the partial block then becomes a common block and the file state remains 7.

File state 9 is a stable state, since a file may remain with two full common blocks for a time during which no additional data are written to the file. But there is no active block designated when the file is in that state. Since the limit of two fractal blocks exists, a data transition must therefore be made before additional data can be written to the file. In the one case, all the data of the file in one of the two full common blocks may be moved to an erased block and this block then becomes an active program block for writing new data of the file. The file has then transitioned from state 9 to state 8. But if the amount of data of the file in one of the two full common blocks plus additional data of the file total less than the capacity of a block, then enough erased space is sought in a partial block. If found, data of the file from one of the full common blocks are moved into the partial block and it then becomes an active common block for writing the additional data for the file. This results in a transition from state 9 to state 7.

When in file state 8, data of the file are being written to an active program block while other data of the file remain stored in a full common block. When the program block becomes full, it becomes a file block and there is no longer an active block for the file. The state then transitions to state 5, where a further file transition allocates either an erased block or a partial block as the new active block, as described above.

But when in state 8 and the active program block of the file is selected as a destination block for a reclaim operation, the file state transitions directly to state 7, in a first case. This creates a common block which is active to receive the new data of the file. Alternatively, if the active program block for the file when in state 8 is designated as the source block of a reclaim operation, data of the file are moved into a partial block which then becomes an active common block for writing additional data to the file. The file state has also transitioned from state 8 to state 7, in a second case.

Figure 19B:
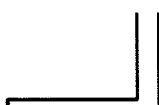
FIG. 19 is a table that describes the secondary file state transitions illustrated in the state diagram of FIG. 18.

In addition to the primary file state transitions illustrated in FIGS. 16 and 17, there are a set of secondary file transitions that occur. These are shown in FIGS. 18 and 19. These secondary transitions of a current file of interest occur when all of the data of one file stored in a fractal block containing data of the current file become obsolete. The obsolete data may be of the current file or of some other file. Data may become obsolete as a result of a file being deleted by a host, data previously written for a file being updated by a host, or data for a file being relocated during a reclaim operation. In the course of a file being updated, for example, all of the data for the file stored in a common block are rendered obsolete when all are updated by new data written into another block. In an example of a reclaim operation, if data of a file in a common block, which is not of the current file of interest, are copied into another block, that leaves the data of the other file in the common block obsolete.

The rendering of data to be obsolete in these circumstances causes the types of blocks in which the obsolete data are stored to change, with a resulting change in the state of a file. When a new active block is needed for data of the file, it is selected in the manner described with respect to FIGS. 16 and 17 but based upon the new file state.

The transitions of FIG. 18 and identification in FIG. 19 of the specific transitions that occur provide a full description of them. It will be noted that these transitions tend to reduce the number of fractal blocks containing data of a file, thus simplifying the file states. These transitions tend to cause the state of a file to migrate towards state 0 which has no fractal blocks.

Information of the file state is used for determining the type of block to be allocated as the active block for the file when data are to be programmed for a file and no active block currently exists for the file. The table of FIG. 20 summarizes in the right hand column the allocation of active blocks for files in any one of states 0-9 under the conditions set forth in the middle column. The type of block that is selected in the order shown. By "best fit partial block" is meant a partial block having an amount of erased capacity that the known amount of data can efficiently utilize. If there is not a suitable partial block, an erased block is most commonly chosen. But if a best fit parital block cannot be identified for a file in either of states 2 or 3, a "biggest partial block" is allocated, which is a block that does not have enough erased capacity to hold the entire amount of data to be written but which is the block that can hold the greatest amount of that data. The file then changes its state, and the new state controls the selection of the block to receive the remaining amount of data that does not fit into the biggest partial block. But if because of the amount of data and the available capacity in partial blocks, use of the biggest partial block makes it likely that the data will be spread out over more than two blocks, then an erased block is allocated as the active block.

The operations described above may be carried out by the processor 27 of the controller 11, executing stored firmware, in the example memory system shown in FIG. 2.

Reclaiming Block Capacity

As described above, part of the block management includes reclaiming unused capacity in blocks for the storage of new data. This is not of particular concern when the amount of data stored in the memory system is far less than its capacity but a memory system is preferably designed to operate as if it is full of data. That means that blocks which contain only obsolete data, and other blocks that contain valid data but also have some obsolete data and/or unwritten erased pages, can be dealt with in a manner to reclaim this unused capacity. The goal is to utilize the storage capacity of the memory system as completely as possible, while at the same time minimizing adverse effects on performance of the system. Reclaiming of blocks is noted as 617 in the overall system operation diagram of FIG. 11.

Any valid data in a block designated for a reclaim operation (source block) is copied into one or more blocks (destination blocks) with sufficient erased capacity to store the valid data. The destination block is selected in accordance with the block management techniques described above. The data of each file stored in the source block are copied to a type of block that is selected on the basis of the state of file and other factors, as described above. Examples of data copying between different types of files as part of reclaims operation are given in FIGS. 21A-21D.

Figure 21A:
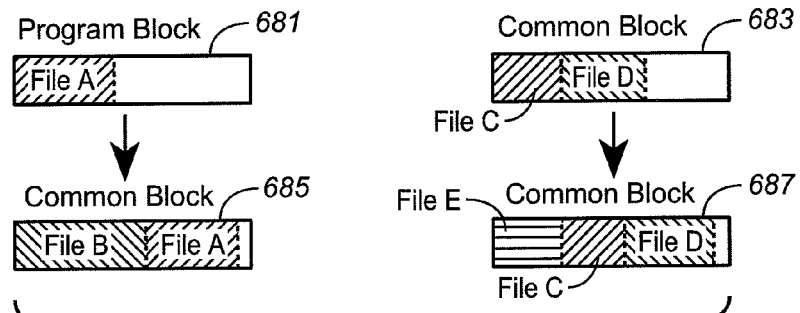
FIGS. 21A-21D show examples of block reclaim operations.

In FIG. 21A, reclaim operations on two partial blocks 681 and 683 are illustrated, as examples. The block 681 is a program block in which valid data of a file A are stored, while also containing erased capacity storing no data. One possible reclaim operation, depending upon the state of file A, is to copy data of file A of block 681 into available erased capacity of another partial block 685 that already includes data of a different file B, thus making it a common block. The data group(s) in the block 681 is then no longer referenced in the FIT and the block the block is noted to be obsolete. When stored in block 681, file A had one of states 2, 4 or 8 (see FIG. 15) that includes a program block. The data may then be moved to another fractal block while the file remains written to a maximum of two fractal blocks. After copying to block 685, file A has transitioned to one of the states 3, 4, 6 or 7, which include data of the file being stored in a common block, depending on the types of blocks in which other data of the file are stored.

The block 683 of FIG. 21A is a common block that is being reclaimed by copying its stored data of files C and D into erased capacity of a program block 687 containing data of file E, which then becomes a common block. The data of files C and D in the block 683 are then obsolete, as is the block itself. The state of each of the files C and D has not changed since the data have been moved from one common block to another. However, the state of file E has changed either from 2 to 3 or from 8 to 7. Alternatively, the data of each of the files C and D can be moved to different blocks from each other and need not necessarily be copied to available space of a common block. The states of the files could then possibly transition to other states.

Figure 21B:
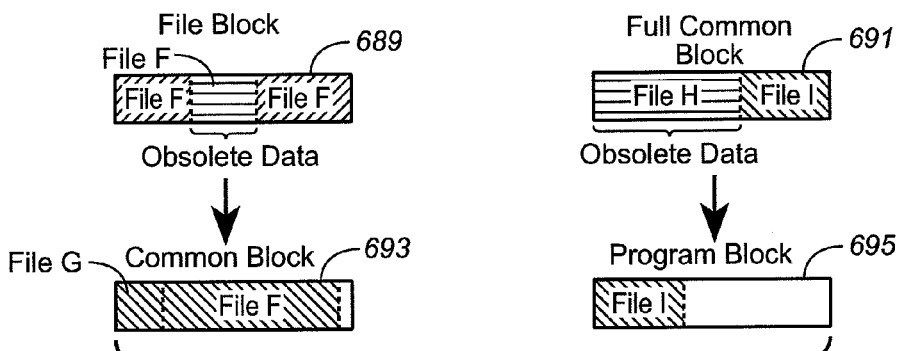

Illustrated in FIG. 21B are reclaim operations on example blocks 689 and 691. Each of these blocks is an obsolete block since it is full of data, both valid and obsolete. The block 689 is a file block containing data of a file F, a portion of which are obsolete and the remainder valid. This can occur, for example, during an update of file F where new data are physically written at the end of the file that have the same logical offsets as existing data of the file, and the existing data then become obsolete. In this example, the data of File F are copied into erased capacity of a program block 693 containing data of a file G, resulting in changing the type of block 693 to a common block. The valid data of the file F could alternatively be written to an erased block, which would then result in the block being a program block.

The block 691 of FIG. 21B is a full common block containing invalid data of file H and valid data of file I. The valid data of file I is copied, in this example, from the block 691 into an erased block 695. The block 695 then becomes a program block. Alternatively, the data of file I could be written to a partial block containing data of another file, if a good fit can be found. The destination block will depend upon the state of file I at the time of the reclaim operation.

Figure 21C:
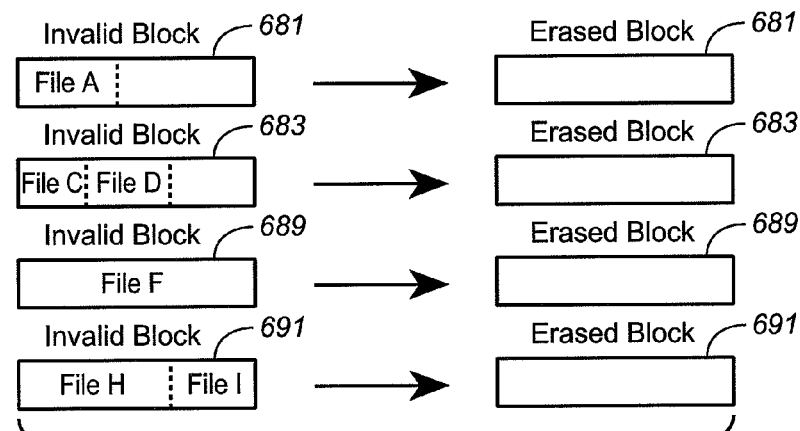

As a result of each of the four specific examples of reclaim operations shown in FIGS. 21A and 21B, data stored in two partial blocks are combined into one, thereby leaving the other of the two blocks with only obsolete data. They are then invalid blocks. The entire space of each of the original blocks 681, 683, 689 and 691 is then reclaimed by erasing the block, as illustrated in FIG. 21C. An erased block is the result of reclaiming an invalid block.

Figure 21D:
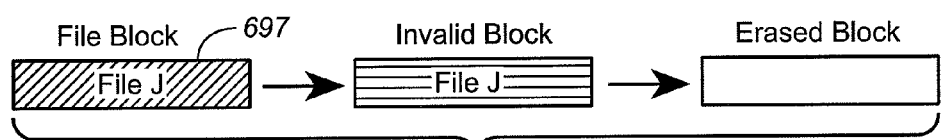

FIG. 21D shows an example of a file block 697 in which data of a file J are stored. When file J is deleted by the host, the data of file J in block 697, and possibly also in other blocks, are rendered obsolete. The block 697 then becomes invalid. Reclaiming the invalid block provides an erased block for the system erased block pool.

The deletion of a file from the memory also commonly causes data of the file in one or more fractal blocks, such as a common block or a full common block, to become obsolete. That block is then subject to a reclaim operation since the remaining valid data of another file will be less than the storage capacity of the block and can be a small amount.

Figure 22:
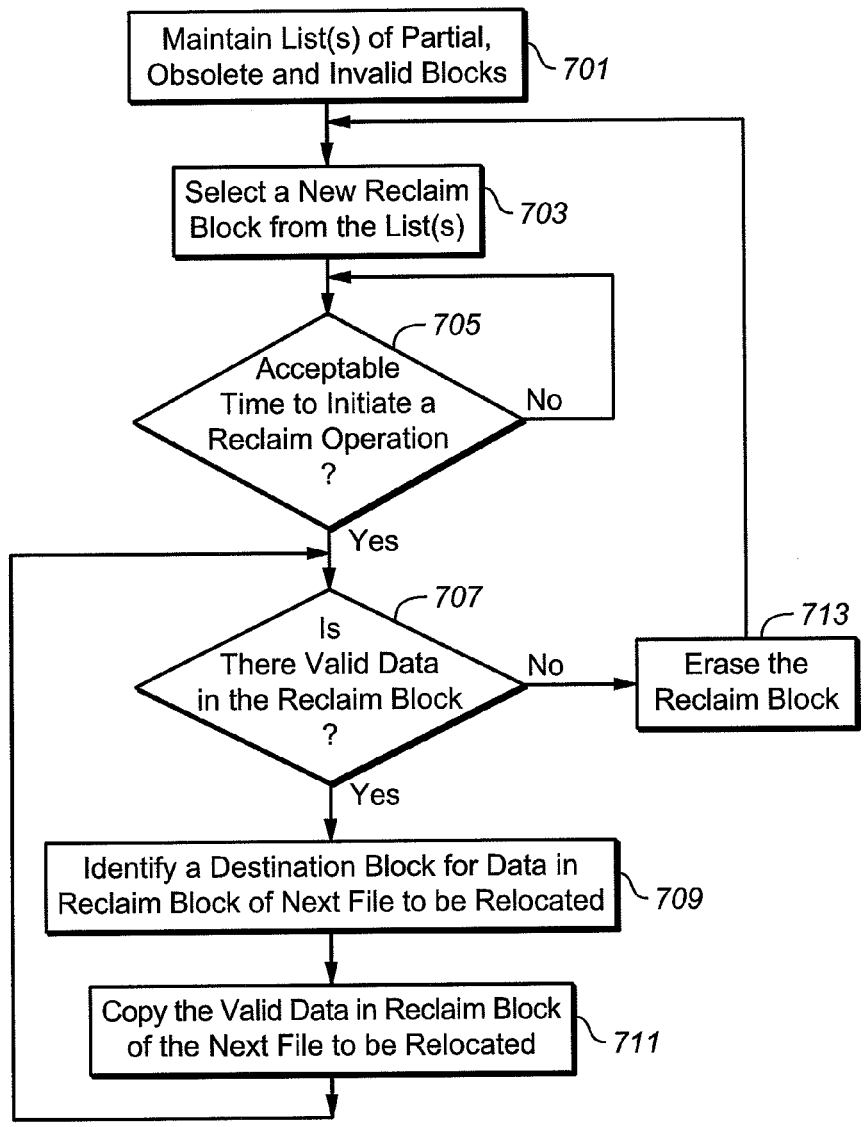
FIG. 22 is a flowchart that illustrates a reclaim operation in general terms.

A reclaim operation is shown in general terms by a flowchart of FIG. 22. One or more lists are maintained for partial, obsolete and invalid blocks, depending upon the specific embodiment, as indicated by a step 701. The list(s) may be kept as part of the block lists 615 (FIG. 11). According to one memory operational technique, this list(s) of blocks is built at the time of initiation of the memory system, such as when power is first applied. This list(s) can include other information of the blocks that enable the selection of one reclaim block at a time, such as the amount of valid data in each block and the amount of erased memory in each block. These quantities are typically measured in terms of a number of pages of the block, or metapages if metablocks are being used. A preferred alternative technique is to maintain these lists in non-volatile memory and to add or update an entry for a block in the list whenever its status changes. With this technique, it is not necessary to scan the blocks and build the lists when the memory system is initialized. As an alternative to keeping all partial, obsolete and invalid blocks on the list(s), only those blocks that have a small amount of valid data below some set threshold amount are included, since one characteristic of a chosen reclaim block is that it has little or no valid data that needs to be copied. It is the copying of data from one block to another, necessary in many reclaim operations, which takes a significant amount of time, so this is usually performed first on those blocks having the lesser amount of data to be copied.

The list(s) of such blocks changes constantly as data are written, updated, moved, deleted, and so forth. Changes that result in blocks changing their types to and from partial, obsolete and invalid cause the list(s) maintained by the step 701 of FIG. 22 to change. Changes in the amount of valid data individually stored in such blocks, and in the amount of erased capacity are also noted in the block lists 615 (FIG. 11).

In a step 703, a single reclaim block is preferably identified from those on the updated list(s) as the next in order to be reclaimed. If a partial or obsolete block, it is a source of valid data to be copied into another block referred to as a destination block. Several specific techniques that may be used to select the source block are described below.

A next step 705 then determines whether it is appropriate to perform the reclaim operation at the current time, considering the memory operations that need to be performed in response to commands of a host. If the host has sent an idle command to the memory system, or something similar that indicates there will be some period of time when the host will not be expecting the memory system to perform a particular operation, then the memory system is free to carry out overhead operations in the foreground including a reclaim operation. Even if the memory system is busy writing data to or reading data from the memory in response to a host command, the reclaim operation, particularly its data copying, can be interleaved with data write and read operations. Such interleaving is described in U.S. patent application Ser. No. 11/259,423 of Alan Sinclair, filed Oct. 25, 2005, and Ser. No. 11/312,985 of Alan Bennett et al., filed Dec. 19, 2005.

If it is determined by the step 705 that a reclaim operation may be carried out, the process differs depending on whether the identified reclaim block contains valid data, and, if so, whether it contains valid data of more than one file. If a partial block or obsolete block, it will, by definition, contain valid data, and, if a common block or a full common block, will contain valid data of two or more files. Whether or not there is valid data in the reclaim block is determined by a step 707. If there is valid data that must be moved, data of a single file are identified and a destination block is identified to receive that data, in a next step 709. The destination block is identified by the process described above with respect to FIGS. 15-17, in order to maintain all the data of the file to which the valid data belongs stored in two or fewer fractal blocks (in this example). Copying of the valid data of one file from the source reclaim block to the destination block is then begun, as indicated by a step 711. After these data are copied, the processing returns to the step 707 to determine whether data of another file remains. If so, the process of steps 709 and 711 are repeated for the additional data. The destination block is selected independently of the earlier selection for data of a different file. This continues until it is determined in the step 707 that there is no more data in the source block to be moved, in which case the source block may be erased, per a step 713. This block may then be placed into the erased block pool for use to store new data.

Returning to the step 707, if the source block contains no valid data, which is the case for an invalid block, there is no valid data to be moved. The source block only needs to be erased. The processing therefore, in that case, bypasses the steps 709 and 711, as shown in FIG. 22.

In a first embodiment of the process of FIG. 22, a single list is maintained by the step 701 of partial, obsolete and invalid blocks. The amount of valid data in the block is included in the individual entries on the list. In the step 703, the block selected from the list as the reclaim block is that having the least valid data. If there is one invalid block on the list, that block will be selected first since it has no valid data. If there are many invalid blocks on the list, the one that has been there the longest is chosen. If there is no invalid block on the list, then a block having the least amount of valid data is chosen as the reclaim block. By choosing the block having the least amount of valid data of all the blocks on the list, the reclaim operation then takes less time than when there is more valid data to be copied from one block to another. As a result, other operations of the memory system, such as the speed of writing data to and reading data from the memory, are maintained at a high rate. A newly erased block is obtained at a lesser cost to memory performance.

This first embodiment of the process of FIG. 22 for selecting a source block on the basis of the amount of valid data in fractal blocks on a single list has an advantage of being relative simple to implement. However, this process may be refined by also considering the value of partial blocks. Partial blocks have erased capacity into which data may be written, while neither the obsolete block nor the invalid block contains any erased capacity. Before obsolete blocks may be used for storing new data, any valid data must be moved out of them and into another block, so that they may then be erased and made available for the storage of new data. But partial blocks have erased capacity into which data may be written without having to endure the overhead of a reclaim operation. It may not be beneficial, for example, to reclaim a partial block only because it contains the least amount of valid data when it also contains a large amount of erased capacity into which data may be written.

Figure 23:
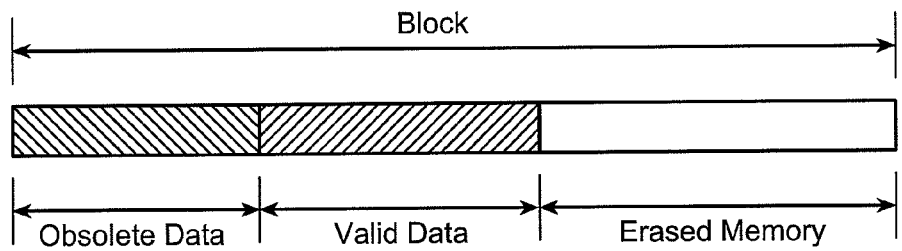
FIG. 23 illustrates types of data stored in a typical partial memory cell block.

Therefore, in other embodiments of the process of FIG. 22, a partial block is selected as a candidate for the reclaim source block on the basis of both the amount of valid data and the amount of erased capacity that exist in the partial blocks. The components of data in a partial block are shown in FIG. 23. The block (can be a metablock) has a certain number of one or more pages (can be metapages) containing valid data and one or more other pages that are erased and into which data may be written. The partial block may also contain one or more other pages that contain obsolete data, as shown in example of FIG. 23.

In these other embodiments of the process of FIG. 22, the partial blocks are preferably maintained by the step 701 in a list that is separate from list(s) of obsolete and invalid blocks. Partial blocks are moved toward a head of their list for a reclaim operation when they have little erased capacity (which means that they are not very useful in their present state) and small amounts of valid data that need to be moved. Such blocks will primarily contain obsolete data. Conversely, partial blocks having large amounts of erased capacity (meaning that they are potentially useful to store data) and large amounts of valid data to be moved will be the least likely to be identified as candidates for the reclaim block. Reclaiming a partial block with erased capacity does not add the same amount of storage capacity to the memory system as does reclaiming an obsolete block. Invalid blocks are clearly the most attractive blocks to reclaim since they have no beneficial erased capacity and no valid data that need to be copied.

In a second embodiment of the reclaim block identification step 703 of FIG. 22, three separate lists are maintained by the step 701, one for each of the partial, obsolete and invalid blocks. If there are invalid blocks, the reclaim block is selected from the list of invalid blocks until there are no more blocks on that list. There is no particular order of listing invalid blocks except possibly in a first-in first-out (FIFO) order so that the invalid block that has been on the list the longest is chosen first. Next, if there are no invalid blocks, a block is chosen from the obsolete block list that has the least amount of valid data of all the blocks on that list.

If there are no blocks on either of the invalid or obsolete lists, then a block on the partial block list is chosen in step 703 as the reclaim block. Although a partial block could be chosen to be that with the least amount of valid data, it is preferred to rank the partial blocks in a way that recognizes the benefit of their erased capacity. For this purpose, a "reclaim gain" can be calculated for each partial block, as follows:

$$\text{reclaim gain} = \frac{(S - kE)}{V} \quad (1)$$

where S is the block size in terms of its total number of data storing pages, E is the number of pages of erased capacity into which data may be written and V is the number of pages containing valid data that needs to be moved to another block. A constant k is included to weight the positive effect of the erased capacity of the block but can be set at 1. As the value of kE increases, the resulting reclaim gain goes down. As the value of V goes up, the reclaim gain also goes down. The partial block with the highest value of reclaim gain is selected in the step 703 as the reclaim block. Other mathematical expressions can alternately be used to define a reclaim gain in terms of E and V that balance the detriment to system operation of containing valid data and the benefit of having erased capacity. The reclaim gain may be calculated each time there is a change in the block, such as each time data are written into its erased capacity, and stored as part of the information maintained by file directory or FIT.

Figure 25:
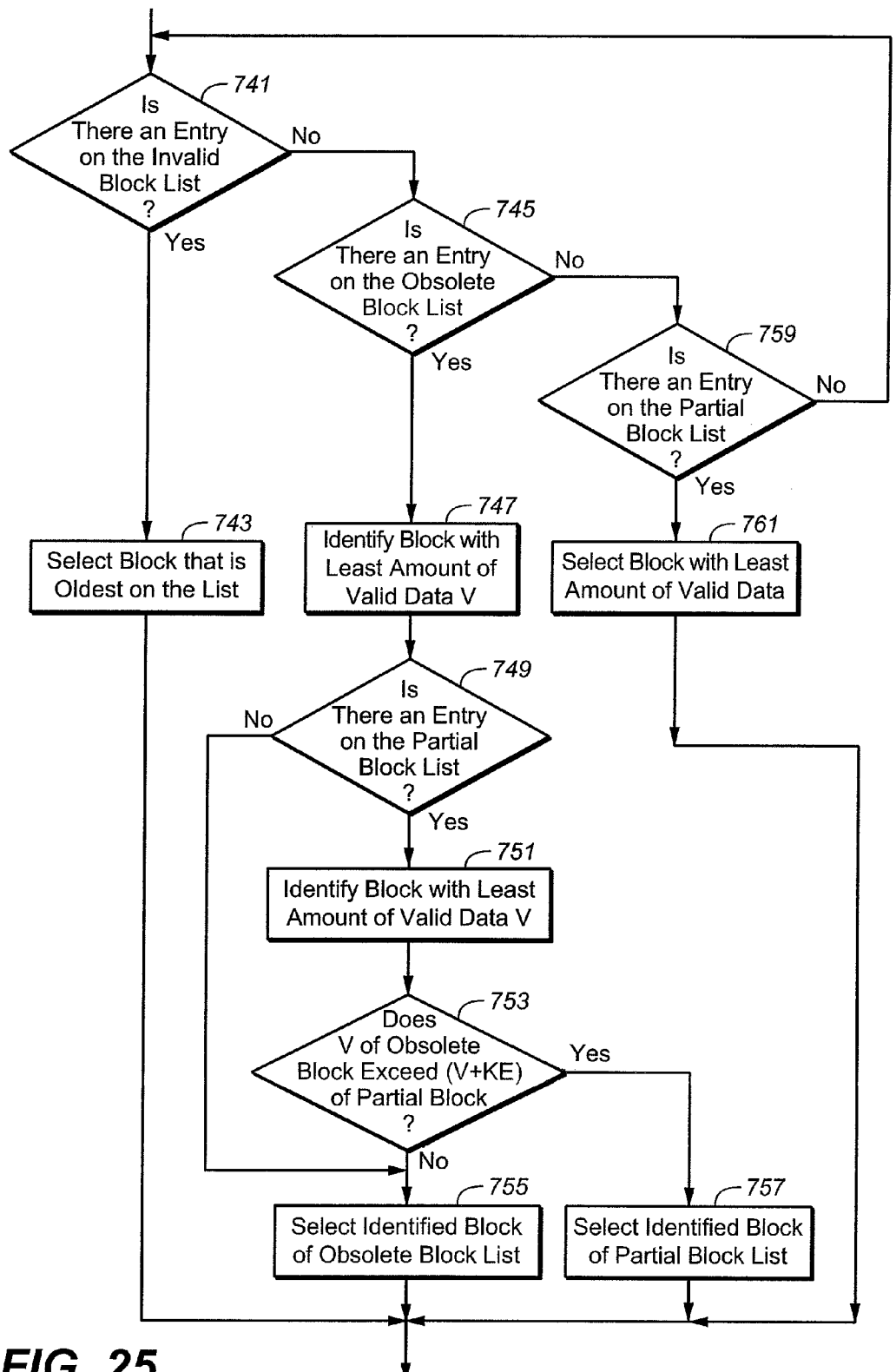
FIG. 25 provides details of an alternate embodiment to execute the same step of the flowchart of FIG. 22.

This second embodiment is illustrated in FIG. 25, which shows a method of selecting a reclaim block (step 703 of FIG. 22) from separate partial, obsolete and invalid block lists (as maintained by step 701 of FIG. 22). A step 721 first determines whether there is a block listed on the invalid block list. If there are multiple such blocks, the block that has been on the list the longest is selected by a step 723 as the reclaim block. If there is no block on the invalid block list, then it is determined by a step 725 whether there is an entry on the obsolete block list. If so, in the case where more than one block is on the obsolete block list, the block having the least amount of valid data is selected by a step 727 as the reclaim block. If it is determined by the step 725 that there is no entry on the obsolete block list, then the partial block list is consulted in a step 729. When there is more than one block on the partial block list, the one having the highest reclaim gain is selected as the reclaim block. The reclaim gain takes into account the amount of valid data and erased capacity in the block, such as by using equation (1) above. If there is nothing on the partial block list, the process is repeated, by returning to the step 721, until a block appears on one of the lists. After the selection of a reclaim block, the processing proceeds to step 705 of FIG. 22.

Figures 24, 26:
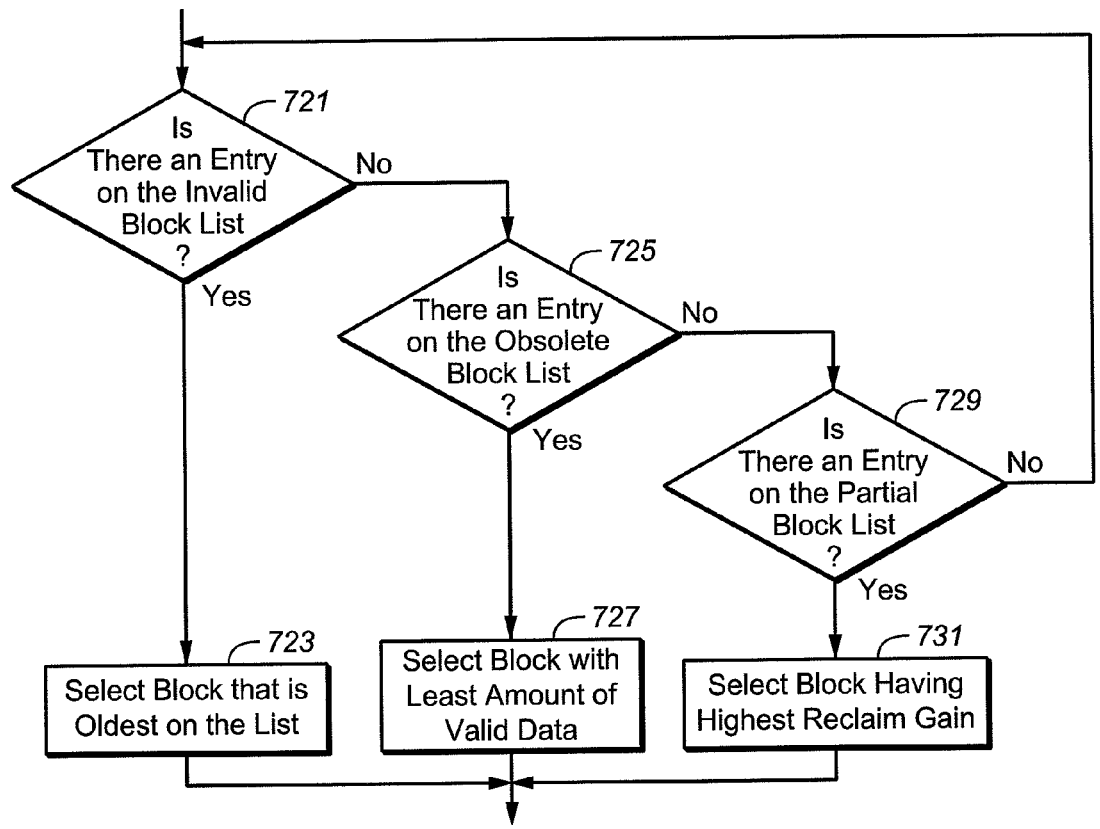
FIG. 24 provides details of a specific embodiment that carries out one of the steps of the flowchart of FIG. 22.
FIG. 26 is a table defining the block types placed on two block lists of yet another embodiment.

A third embodiment is shown by a flowchart of FIG. 24. Execution of the step 703 of FIG. 22 also starts by a step 741 that looks for an entry on the invalid block list maintained by the step 701 of FIG. 22. If there is more than one entry on the invalid block list, the oldest is selected by a step 743 of FIG. 25 to be the reclaim block. If there is no entry on the invalid block list, a next step 745 determines whether there is an entry on the obsolete block list. If so, subsequent steps differ from the embodiment of FIG. 24 in that, if there is also at least one entry on the partial block list, it is determined whether it is best to select the reclaim block from the obsolete or partial block lists.

A step 747 identifies the block on the obsolete block list that contains the least amount of valid data. It is then determined whether at least one block exists on the partial block list, by a step 749, and, if so, the block with the least amount of valid data is identified, in a step 751. A next step 753 then makes a choice between the one block identified from the obsolete block list and the one block identified on the partial block list. For this purpose, a quantity (V+kE) is calculated for the block identified from the partial block list in the step 751, the terms V, E and k being the same as used above. It is this quantity that is compared with the amount V of valid data in the block identified in step 747 from the obsolete block list. If the (V+kE) quantity for the partial block is greater than V of the obsolete block, then the obsolete block is chosen as the reclaim block, in a step 755. But if the V of the obsolete block is greater than the (V+kE) quantity of the identified partial block, then the partial block is selected in a step 757 as the reclaim block.

By adding the erased capacity quantity kE of the identified partial block to its valid data V before comparing with only the valid data V of the identified obsolete block, the process is biased in favor of selecting the obsolete block. An identified partial block with the same amount of valid data as an identified obsolete block will be retained since it is still has a potential use to store data in its erased capacity. Indeed, a partial block having an amount of valid data that is less than that of an obsolete block by an amount kE will be retained.

Returning to the step 745 of FIG. 25, if there is no entry on the obsolete block list, then it is determined in a step 759 whether there is a block listed on the partial block list. If not, the process returns to the step 741 to be repeated until a block is placed on one of the three lists. If there are multiple partial blocks listed, then, in a step 761, the block having the least amount of valid data is selected as the reclaim block. Alternatively, the partial block may be selected by use of the reclaim gain as described with respect to step 731 of the second embodiment (FIG. 24).

The third embodiment may alternatively make use of only two lists. The first list is an obsolete block list that contains entries for blocks that contain obsolete data and no erased memory capacity. Rather than using a separate invalid block list as show in FIG. 25, both invalid and obsolete blocks are placed on a single "obsolete" block list. The blocks may optionally contain valid data. Each entry in the list has a field containing a value defining the amount of valid data in the block to which it relates. The entries in the list are ordered according to the values in these fields. Blocks containing obsolete data and no valid data (invalid blocks) are therefore grouped together at the head of this first list.

The second list in this alternative to the third embodiment is a partial block list that contains entries for blocks that contain some erased memory capacity. The blocks may optionally contain valid data. Each entry in the list has a field containing a value defining the amount of valid data in the block to which it relates. The entries in the list are ordered according to the values in these fields. A block may be selected from the head (block with the least amount of invalid data) of either the first or second list by the technique of step 753 of FIG. 25.

A table of FIG. 26 sets forth details of the types of blocks that are placed on the partial and obsolete block lists for a reclaim operation according to this modification of the third embodiment. To be placed on the partial block list, a block contains both valid data and erased capacity. It does not matter whether there is any obsolete data in the block. To be placed on the obsolete block list, the block contains obsolete data and either valid data or erased capacity but not both.

The processes described above with respect to FIGS. 22, 24 and 25 may be carried out by the processor 27 of the controller 11, executing stored firmware, in the example memory system shown in FIG. 2.

CONCLUSION

Although the various aspects of the present invention have been described with respect to exemplary embodiments thereof, it will be understood that the present invention is entitled to protection within the full scope of the appended claims.

It is claimed:

1. A reprogrammable non-volatile memory system, comprising:
blocks of non-volatile memory cells characterized by being erased prior to rewriting data therein, and
a controller functionally connected with the blocks and that operates to select a block having a portion of its storage capacity not occupied by valid data to be reclaimed for use to store valid data on the basis of a combination of a relative amount of valid data stored and a relative amount of erased capacity remaining in individual ones of at least a plurality of the blocks, and then causes the valid data of the selected block to be copied to another block, wherein the controller further operates to select the block to be reclaimed on the basis of no obsolete data being contained in individual ones of the at least a plurality of the blocks.

2. The memory system of claim 1, wherein the controller further operates to select the block to be reclaimed on the basis of the least amount of valid data stored in individual ones of the at least a plurality of the blocks.

3. The memory system of claim 1, wherein the controller further operates to select the block to be reclaimed on the basis of the least amount of erased capacity remaining in individual ones of the at least a plurality of the blocks for the storage of data therein.

4. The memory system of claim 1, wherein the controller further operates to select the block to be reclaimed by comparing the amounts of valid data stored in some of the at least a plurality of the blocks by a pre-set relationship between the amounts of valid data and erased capacity of others of the at least a plurality of blocks.

5. A reprogrammable non-volatile memory system, comprising:
an array of non-volatile memory cells organized into blocks of memory cells that are simultaneously erasable, and
a controller operably connected with the array that operates to:

maintain a first list including any blocks that individually contain an amount of valid data plus obsolete data but without erased data storage capacity, determine whether one or more blocks exist on the first list and, if so, identify a first block from the first list that has the least amount of valid data of the blocks thereon, maintain a second list including any blocks that individually contain an amount of valid data plus some erased data storage capacity, determine whether one or more blocks exist on the second list and, if so, identify a second block from the second list that has the least amount of valid data of the blocks thereon, select either the first or second block on the basis of the amount of valid data contained in them after adjusting the amount of valid data in the second block for the amount of erased data storage capacity in the second block, and copy the valid data from the selected block into another block, and thereafter erase the selected block.

\* \* \* \* \*